(12) United States Patent
Toda

(10) Patent No.: US 9,728,579 B2
(45) Date of Patent: Aug. 8, 2017

(54) SOLID-STATE IMAGE PICKUP UNIT AND ELECTRONIC APPARATUS FOR ACHIEVING HIGH SENSITIVITY AND HIGH SATURATION CHARGE AMOUNT

(71) Applicant: SONY CORPORATION, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/428,262

(22) PCT Filed: Sep. 18, 2013

(86) PCT No.: PCT/JP2013/075105
§ 371 (c)(1),
(2) Date: Mar. 13, 2015

(87) PCT Pub. No.: WO2014/050647
PCT Pub. Date: Apr. 3, 2014

(65) Prior Publication Data
US 2015/0228693 A1 Aug. 13, 2015

(30) Foreign Application Priority Data
Sep. 25, 2012 (JP) .................. 2012-210938

(51) Int. Cl.
*H01L 27/148* (2006.01)
*H01L 27/146* (2006.01)
*H04N 5/3745* (2011.01)

(52) U.S. Cl.
CPC .... *H01L 27/14818* (2013.01); *H01L 27/1463* (2013.01); *H01L 27/1464* (2013.01);
(Continued)

(58) Field of Classification Search
CPC ...................................... H01L 27/148
(Continued)

(56) References Cited

U.S. PATENT DOCUMENTS

2007/0145441 A1* 6/2007 Hwang ............. H01L 27/14601
257/291
2008/0296475 A1* 12/2008 Kim .................. H01L 27/14647
250/208.1
(Continued)

FOREIGN PATENT DOCUMENTS

JP   H04-281681   10/1992
JP   2006-311515  11/2006
(Continued)

OTHER PUBLICATIONS

International Search Report prepared by the Japanese Patent Office on Oct. 25, 2013, for International Application No. PCT/JP2013/075105.

*Primary Examiner* — Caleb Henry
(74) *Attorney, Agent, or Firm* — Chip Law Group

(57) ABSTRACT

There is configured a solid-state image pickup unit including a photoelectric conversion section formed on a light incident side of a substrate; a first charge accumulation section accumulating a signal charge generated by the photoelectric conversion section; a second charge accumulation section formed in a region other than a light-condensing region where incident light is condensed in the substrate on a side opposite to a light incident side and formed to be laminated together with the first charge accumulation section in a depth direction of the substrate; and a floating diffusion section formed in a region other than the light-condensing region in the substrate on the side opposite to the light incident side and converting the signal charge into a voltage.

17 Claims, 28 Drawing Sheets

(52) U.S. Cl.
CPC .. *H01L 27/14612* (2013.01); *H01L 27/14623* (2013.01); *H01L 27/14627* (2013.01); *H01L 27/14689* (2013.01); *H01L 27/14812* (2013.01); *H04N 5/3745* (2013.01)

(58) Field of Classification Search
USPC .................................................. 257/40, 229
See application file for complete search history.

(56) References Cited

U.S. PATENT DOCUMENTS

| | | | | |
|---|---|---|---|---|
| 2009/0190014 A1* | 7/2009 | Hong | ................ | H01L 27/14603 348/297 |
| 2009/0302360 A1* | 12/2009 | Shinomiya | ........ | H01L 27/14647 257/292 |
| 2010/0073541 A1* | 3/2010 | Kawahito | ......... | H01L 27/14609 348/311 |
| 2011/0019042 A1* | 1/2011 | Yamaguchi | ....... | H01L 27/14632 348/280 |
| 2011/0032403 A1* | 2/2011 | Mabuchi | ............ | H04N 5/35581 348/296 |
| 2011/0128429 A1* | 6/2011 | Endo | ................... | H01L 27/1463 348/308 |
| 2011/0149102 A1* | 6/2011 | Toda | ................. | H01L 27/14609 348/222.1 |
| 2011/0174987 A1* | 7/2011 | Sawada | ..................... | G01J 3/02 250/459.1 |
| 2011/0234875 A1* | 9/2011 | Maeda | .............. | H01L 27/14603 348/308 |
| 2012/0249852 A1* | 10/2012 | Fukuda | ............. | H01L 27/14605 348/311 |
| 2012/0268566 A1* | 10/2012 | Kim | ..................... | H04N 5/3696 348/46 |
| 2013/0087682 A1* | 4/2013 | Nomura | ................ | C09B 23/105 250/206 |
| 2015/0325721 A1* | 11/2015 | Toda | ................. | H01L 27/14643 348/294 |

FOREIGN PATENT DOCUMENTS

| | | |
|---|---|---|
| JP | 2007-503722 | 2/2007 |
| JP | 2008-034836 A | 2/2008 |
| JP | 2008-053333 A | 3/2008 |
| JP | 2008-060195 A | 3/2008 |
| JP | 2011-159757 A | 8/2011 |
| JP | 2011-204878 A | 10/2011 |
| JP | 2012-4443 A | 1/2012 |

* cited by examiner

SOLID-STATE IMAGE PICKUP UNIT AND ELECTRONIC APPARATUS FOR ACHIEVING HIGH SENSITIVITY AND HIGH SATURATION CHARGE AMOUNT

CROSS REFERENCE TO RELATED APPLICATIONS

This application is a national stage application under 35 U.S.C. 371 and claims the benefit of PCT Application No. PCT/JP2013/075105 having an international filing date of Sep. 18, 2013, which designated the United States, which PCT application claimed the benefit of Japanese Patent Application No. 2012-210938 filed on Sep. 25, 2012, the disclosures of each of which are incorporated herein by reference.

TECHNICAL FIELD

The present technology relates to a solid-state image pickup unit. Moreover, the present technology relates to an electronic apparatus including a solid-state image pickup unit.

BACKGROUND ART

An example of a solid-state image pickup unit is a CMOS (Complementary Metal Oxide Semicondoctor) type image sensor that reads a photocharge accumulated in a pn junction capacity of a photodiode as a photoelectric conversion device through a MOS transistor.

In this CMOS type image sensor, an operation of reading a photocharge accumulated in the photodiode is executed on each pixel, each row, or the like. Therefore, exposure periods in which the photocharge is accumulated in all pixels are not allowed to coincide with one another, and in a case where a subject is moving, or the like, distortion occurs during image pickup.

Therefore, global exposure in which image pickup is performed on all pixels in a same exposure time is executed.

Then, as one method of achieving global exposure, a mechanical shutter system using a mechanical light-shielding means is widely used.

In the mechanical shutter system, the exposure periods in all pixels coincide with one another by mechanically opening and closing a mechanical shutter. Then, signals are sequentially read after the mechanical shutter is closed to bring about a state in which a photocharge is not substantially accumulated.

However, in the mechanical shutter system, a mechanical light-shielding means is necessary; therefore, downsizing is difficult. Moreover, mechanical driving speed has its limit; therefore, simultaneity is lower than that in an electrical method.

Moreover, a global shutter system in which all pixels are driven simultaneously by electrical control without using the mechanical shutter system to achieve global exposure is also used. More specifically, accumulation of signal charges in an entire pixel array starts simultaneously by simultaneously performing reset driving on photodiodes of the pixel array in all pixel rows. Then, the accumulation of the signal charges in the entire pixel array is simultaneously terminated by simultaneously performing transfer driving to charge accumulation sections such as floating diffusions in all pixel rows.

It is to be noted that reading of the signal charges accumulated in the charge accumulation sections is performed by row-sequential scanning.

In a case where this global shutter system is adopted, it is necessary to provide a light-shielding film or the like above the charge accumulation section. When light enters the charge accumulation section in a period in which signals are sequentially read, light is added to the signals as noise; therefore, the light-shielding film or the like is provided to prevent this.

However, in a case where the light-shielding film is provided, an opening area of the photodiode is reduced to cause a reduction in sensitivity and a reduction in saturation sensitivity. Moreover, since the charge accumulation section is provided in a position relatively close to the photodiode where light enters in a lateral direction, during signal reading, light may be leaked by a light diffraction phenomenon, a light scattering phenomenon, or the like to enter the accumulation section, thereby causing an increase in noise. As results of the reduction in saturation sensitivity and the increase in noise, image quality degradation is caused.

Further, when the charge accumulation section is configured of a floating diffusion layer formed on a silicon substrate, a dark current is easily generated by a crystal defect at an interface between the silicon substrate and an oxide film; however, when a charge is held in the floating diffusion layer, a difference in the dark current applied to a signal level is caused by order of reading pixels. This difference in the dark current is not allowed to be cancelled by noise removal by a reset level.

As a technique of solving an issue that the above-described difference in the dark current is not allowed to be removed, a configuration in which a memory section that accumulates a charge is included in addition to the floating diffusion layer in the pixel has been proposed (for example, refer to PTL 1 and PTL 2). The memory section temporarily holds a photocharge accumulated in the photodiode. A transfer gate is provided to transfer the photocharge accumulated in the photodiode to the memory section.

However, in such a configuration in which the memory section is provided, it is necessary to also shield the memory section from light, and a light-shielded area with respect to a pixel area is increased, and the opening area is further reduced; therefore, a further reduction in sensitivity is caused, and saturation sensitivity is reduced.

On the other hand, a means to expand the opening area of the pixel with respect to incident light is a backside illumination type solid-state image pickup unit. In the backside illumination type solid-state image pickup unit, a circuit configured of a transistor, a wiring line, and the like is formed on a substrate surface (a front surface) opposite to a light-incident surface (a back surface); therefore, since there is an advantage that a large opening of the pixel on a light incident side is secured, miniaturization is made possible.

Incidentally, in a case where a global shutter function is added to the backside illumination type solid-state image pickup unit, to prevent entry of light into a front surface side of a semiconductor substrate, a configuration in which a light-shielding film is formed on a light incident side is adopted. In this case, when a large light-shielding film is formed, the opening area of the pixel is reduced, thereby resulting in difficulty in miniaturization.

As a means to eliminate this, a configuration in which a capacitor is provided outside the silicon substrate has been proposed (for example, refer to PTL 3). However, in this configuration, a dark current generated by the capacitor is large; therefore, high image quality is not allowed to be obtained.

Furthermore, there has been proposed a configuration in which a photoelectric conversion film with a high absorption coefficient is used for a photoelectric conversion film of the backside illumination type solid-state image pickup unit to double as a light-shielding film, thereby having a global shutter function (for example, refer to PTL 4).

In this configuration, entry of light into the accumulation section is allowed to be prevented from causing smear noise by providing the photoelectric conversion film on the light incident side of the substrate.

This configuration includes a first accumulation section that temporarily holds a charge generated by the photoelectric conversion film and a second accumulation section for holding signals in a period in which signals are sequentially read after exposure.

CITATION LIST

Patent Literature

PTL 1: Japanese Unexamined Patent Application (Published Japanese Translation of PCT Application) No. 2007-503722
PTL 2: Japanese Unexamined Patent Application Publication No. 2006-311515
PTL 3: Japanese Unexamined Patent Application Publication No. H4-281681
PTL 4: Japanese Unexamined Patent Application Publication No. 2012-4443

SUMMARY OF INVENTION

However, in a configuration in which the above-described photoelectric conversion film is provided, the first accumulation section and the second accumulation section are arranged along a lateral direction of the substrate; therefore, miniaturization of pixels is difficult.

Therefore, it is desirable to provide a solid-state image pickup unit that is capable of miniaturizing pixels, achieves improvements in sensitivity and a saturation charge amount, and achieves favorable image quality by reducing smear noise, and an electronic apparatus including this solid-state image pickup unit.

A solid-state image pickup unit of an embodiment of the present technology includes: a substrate; a photoelectric conversion section formed on a light incident side of the substrate and generating a signal charge according to a light amount; and a first charge accumulation section formed in the substrate on the light incident side and accumulating a signal charge generated by the photoelectric conversion section.

The solid-state image pickup unit further includes: a second charge accumulation section formed in a region other than a light-condensing region where incident light is condensed in the substrate on a side opposite to the light incident side and formed to be laminated together with the first charge accumulation section in a depth direction of the substrate.

The solid-state image pickup unit further includes a floating diffusion section formed in a region other than the light-condensing region in the substrate on the side opposite to the light incident side and converting the signal charge into a voltage.

An electronic apparatus of an embodiment of the present technology includes an optical lens, the above-described solid-state image pickup unit of the embodiment of the present technology; and a signal processing circuit processing an output signal from the solid-state image pickup unit.

According to a configuration of the above-described solid-state image pickup unit of the embodiment of the present technology, since the photoelectric conversion section is formed on the light incident side of the substrate, it is not necessary to provide the photoelectric conversion section in the substrate; therefore, miniaturization of pixels is achievable.

Moreover, since the second charge accumulation section is formed to be laminated together with the first charge accumulation section in the depth direction of the substrate, further miniaturization of pixels is achieved.

Further, by providing the first charge accumulation section, the second charge accumulation section, and the floating diffusion section, a signal charge accumulated in the first charge accumulation section is allowed to be transferred to the second charge accumulation section before being transferred to the floating diffusion section to be temporarily held by the second charge accumulation section. Therefore, simultaneous exposure in all pixels in a global shutter system is possible.

Moreover, according to the configuration of the above-described solid-state image pickup unit of the embodiment of the present technology, the second charge accumulation section and the floating diffusion section are formed in the region other than the light-condensing region where incident light is condensed; therefore, an amount of light incident on the second charge accumulation section and the floating diffusion section is reduced. Accordingly, smear noise generated by entry of light is allowed to be reduced, thereby obtaining a high S/N ratio.

According to a configuration of the above-described electronic apparatus of the embodiment of the present technology, the solid-state image pickup unit of the present technology is included; therefore, in the solid-state image pickup unit, miniaturization of pixels is achieved, and simultaneous exposure in all pixels is possible; therefore, a high S/N ratio is obtained.

According to the solid-state image pickup unit of the embodiment of the present technology and the electronic apparatus including the solid-state image pickup unit, miniaturization of pixels is allowed to be achieved; therefore, downsizing and an increase in the number of pixels are allowed to be achieved. Then, a high-resolution image is allowed to be provided by achieving an increase in the number of pixels.

Moreover, simultaneous exposure in all pixels is possible; therefore, generation of distortion when an image of a moving subject is picked up is allowed to be prevented. Then, since simultaneous exposure in all pixels is possible without providing a light-shielding film, compared to a case where the light-shielding film is provided, an improvement in sensitivity and an improvement in a saturation charge amount are allowed to be achieved by expanding an opening.

Further, since smear noise is reduced to obtain a high S/N ratio, favorable image quality is allowed to be achieved.

Therefore, according to the solid-state image pickup unit of the embodiment of the present technology and the electronic apparatus including the solid-state image pickup unit, high sensitivity and a high saturation charge amount are allowed to be achieved, and an image with high resolution and favorable image quality is allowed to be provided.

DESCRIPTION OF EMBODIMENTS

Some best modes for carrying out the present technology (hereinafter referred to as "embodiments") will be described below.

It is to be noted that description will be given in the following order.
1. First Embodiment (Solid-state image pickup unit)
2. First Modification Example of First Embodiment
3. Second Modification Example of First Embodiment
4. Third Modification Example of First Embodiment
5. Fourth Modification Example of First Embodiment
6. Second Embodiment (Solid-state image pickup unit)
7. Third Embodiment (Electronic apparatus)

1. First Embodiment

Figure 1:
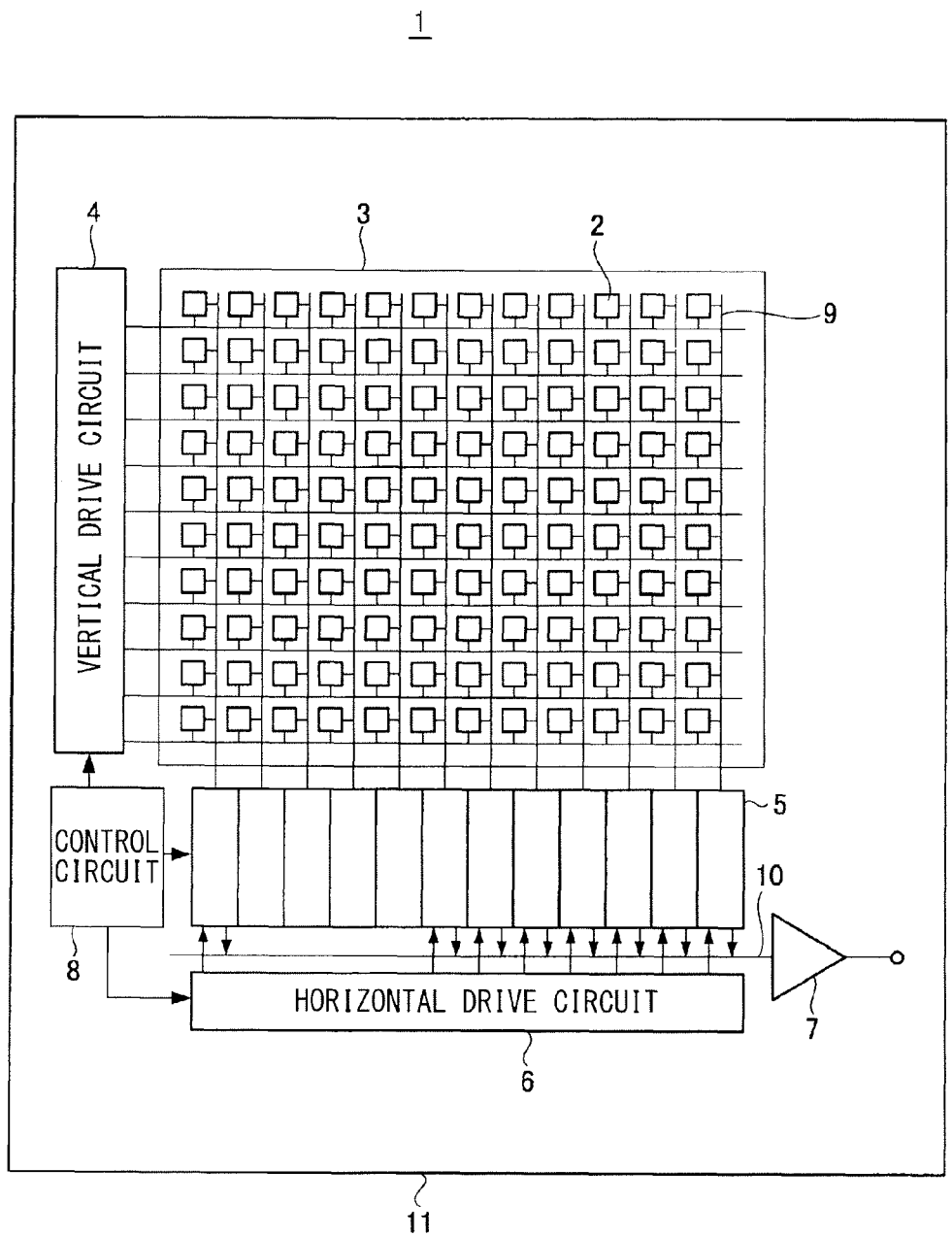
FIG. 1 is a schematic configuration diagram (a plan view) of a solid-state image pickup unit of a first embodiment.

FIG. 1 illustrates a schematic configuration diagram (a plan view) of a solid-state image pickup unit of a first embodiment.

In this embodiment, the present technology is applied to a CMOS type image sensor.

As illustrated in FIG. 1, the solid-state image pickup unit 1 of this embodiment is configured by including a pixel region 3 configured of a plurality of pixels 2 arranged on a substrate 11 made of silicon, a vertical drive circuit 4, a column signal processing circuit 5, a horizontal drive circuit 6, an output circuit 7, and a control circuit 8.

The pixel 2 is configured of a photoelectric conversion section that is configured of a photodiode and a plurality of pixel transistors, and a plurality of pixels 2 are regularly arranged in a two-dimensional array on the substrate 11.

Examples of the pixel transistors configuring the pixel 2 may include a transfer transistor, a reset transistor, a selection transistor, and an amplification transistor.

The pixel region 3 is configured of the plurality of pixels 2 regularly arranged in a two-dimensional array. The pixel region 3 is configured of an effective pixel region in which a signal charge generated by performing photoelectric conversion on incident light is amplified and read to the column signal processing circuit 5 and a black reference pixel region (not illustrated) for outputting optical black as a reference of a black level. The black reference pixel region is typically formed at the outer periphery of the effective pixel region.

The control circuit 8 generates a clock signal, a control signal, and the like as references of operations of the vertical drive circuit 4, the column signal processing circuit 5, the horizontal drive circuit 6, and the like, based on a vertical synchronization signal, a horizontal synchronization signal, and a master clock. Then, the clock signal, the control signal, and the like generated by the control circuit 8 are input to the vertical drive circuit 4, the column signal processing circuit 5, the horizontal drive circuit 6, and the like.

The vertical drive circuit 4 may be configured of, for example, a shift register, and sequentially selects and scans respective pixels 2 of the pixel region 3 in a vertical direction from one row to another. Then, a pixel signal based on a signal charge generated according to an amount of light received by the photodiode of each of the pixels 2 is supplied to the column signal processing circuit 5 through a vertical signal line 9.

The column signal processing circuit 5 may be arranged for each column of the pixels 2, and performs signal processing such as noise removal and signal amplification on signals output from the pixels 2 belonging to one row from one pixel column to another by a signal from the black reference pixel region (that is not illustrated, but is formed at the outer periphery of the effective pixel region). A horizontal selection switch (not illustrated) is provided in an output stage of the column signal processing circuit 5 between the column signal processing circuit 5 and a horizontal signal line 10.

The horizontal drive circuit 6 may be configured of, for example, a shift register, and sequentially selects respective column signal processing circuits 5 by sequentially outputting horizontal scanning pulses to output pixel signals from the respective column signal processing circuits 5 to the horizontal signal lines 10.

The output circuit 7 performs signal processing on signals supplied from the respective column signal processing circuits 5 through the horizontal signal lines 10 to output the signals.

Next, a configuration of each of the pixels 2 of the solid-state image pickup unit 1 of this embodiment will be described below.

The solid-state image pickup unit 1 of this embodiment is a solid-state image pickup unit with a backside illumination type configuration in which a front surface of a semiconductor substrate serves as a circuit formation surface and a back surface of the semiconductor substrate serves as a light incident surface.

Figure 2:
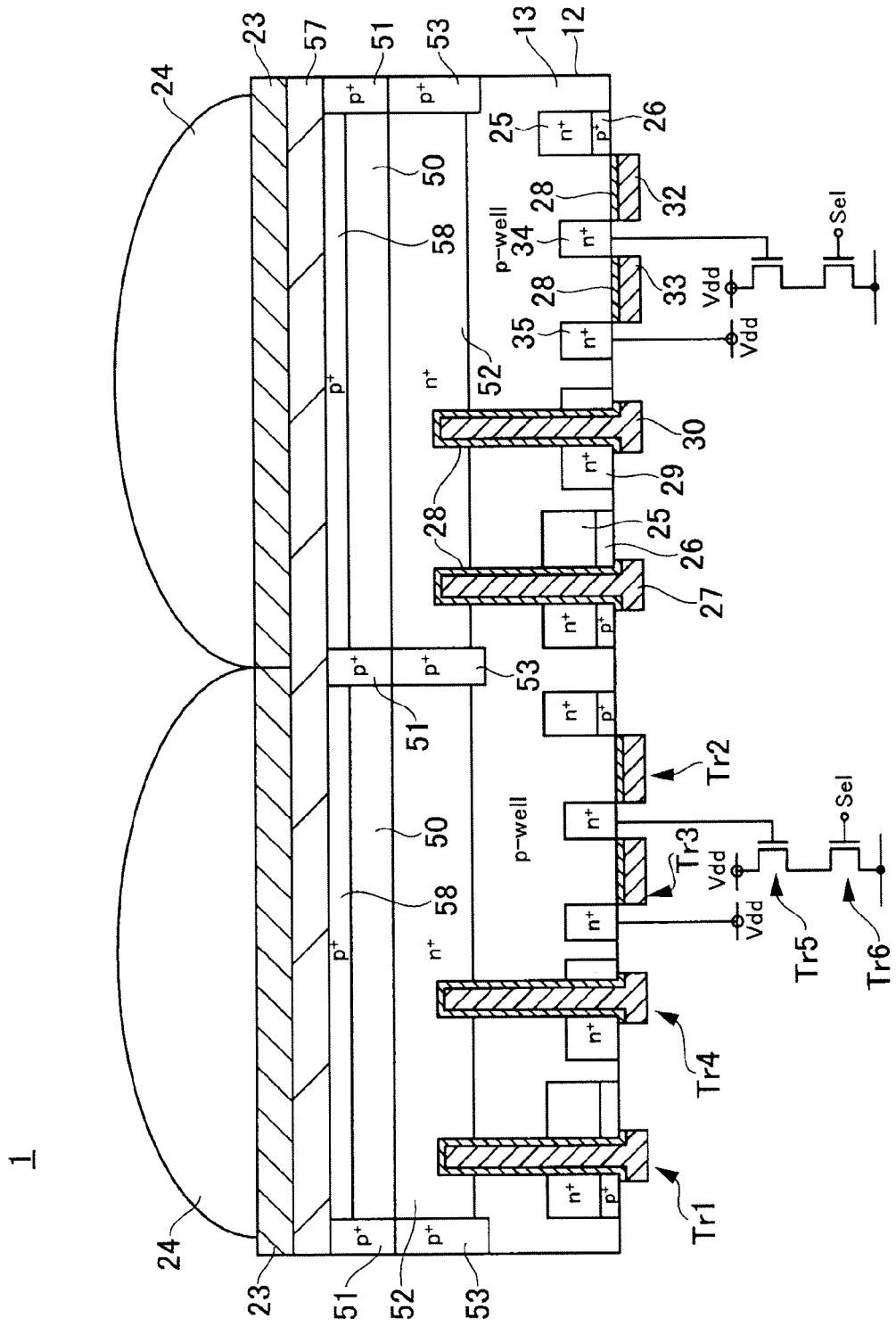
FIG. 2 is a sectional view in a pixel region of the solid-state image pickup unit of the first embodiment.
Figure 3:
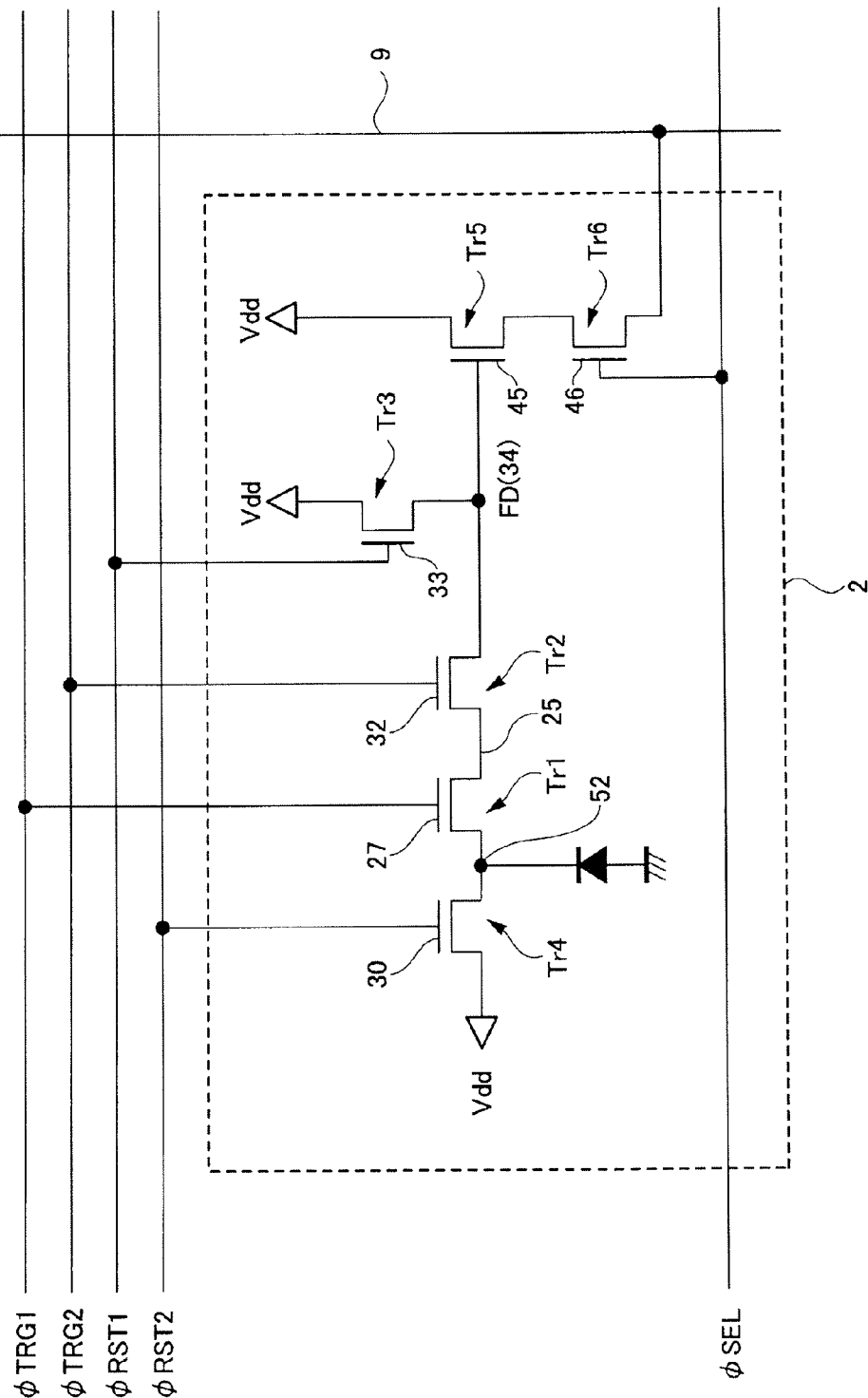
FIG. 3 is an equivalent circuit diagram of a pixel of the solid-state image pickup unit of the first embodiment.

FIG. 2 illustrates a schematic sectional view in the pixel region 3 of the solid-state image pickup unit 1 of this embodiment. Moreover, FIG. 3 illustrates an equivalent circuit diagram of each of the pixels 2 of the solid-state image pickup unit 1 of this embodiment. It is to be noted that a circuit diagram of some of the pixel transistors configuring each pixel 2 is illustrated in FIG. 2.

As illustrated in FIG. 2, the solid-state image pickup unit 1 of this embodiment includes a first charge accumulation section 52, a second charge accumulation section 25, a floating diffusion section 34, and a substrate 12 in which a plurality of pixel transistors are formed.

Moreover, the solid-state image pickup unit 1 of this embodiment includes a wiring layer that is not illustrated on the front surface side of the substrate 12. Further, the solid-state image pickup unit 1 of this embodiment includes, on the back surface serving as the light incident surface of the substrate 12, a photoelectric conversion section 50, a p-type semiconductor layer 58, a transparent electrode 57, a color filter layer 23, and an on-chip lens 24 that are so formed as to be laminated.

The substrate 12 is configured of an n-type semiconductor substrate (for example, an n-type silicon substrate), and may be formed with, for example, a thickness of 3 μm to 5 μm.

Moreover, the pixel region 3 in which impurity regions configuring respective pixels 2 are formed serves as a second conductivity type (p-type in this embodiment) well region 13. Then, the respective pixels 2 are partitioned by a pixel isolation section 53 formed in the substrate 12. The pixel isolation section 53 is formed of a highly concentrated p-type semiconductor layer formed at a desired depth from the back surface side of the substrate 12, and is so provided as to electrically isolate adjacent pixels from each other.

Then, the first charge accumulation section 52 and the second charge accumulation section 25 configuring each pixel 2, the floating diffusion section 34, and source-drain regions 29 and 35 configuring respective pixel transistors are formed in the p-type well region 13.

Moreover, each pixel 2 includes six pixel transistors, i.e., a first transfer transistor Tr1, a second transfer transistor Tr2, a first reset transistor Tr3, a second reset transistor Tr4, an amplification transistor Tr5, and a selection transistor Tr6.

The first charge accumulation section 52 is configured of an n-type semiconductor layer formed from the back surface side (the light incident side) of the substrate 12 to a predetermined depth. The first charge accumulation section 52 is formed for each corresponding pixel, and is formed in an entire region of a unit pixel partitioned by the pixel isolation section 53 in each pixel.

The first charge accumulation section 52 functions as an accumulation section that accumulates a signal charge generated by the photoelectric conversion section 50 that will be described later.

Further, the first charge accumulation section 52 may preferably have a configuration in which an impurity is so distributed as to allow an n-type impurity concentration to increase from the back surface side of the substrate toward a depth direction. Since the first charge accumulation section 52 has such a configuration, the first charge accumulation section 52 is allowed to have a potential gradient in which a potential increases toward the depth direction of the substrate 12. Accordingly, an internal electric field is generated in the substrate by the potential gradient, and a signal charge (electrons in this embodiment) having moved from the photoelectric conversion section 50 automatically moves to the front surface side of the substrate 12 in the first charge accumulation section 52 by this internal electric field.

The second charge accumulation section 25 is configured of an n-type semiconductor layer formed on the front surface side (a side opposite to the light incident side) of the substrate 12. The second charge accumulation section 25 is arranged in a position overlapping the first charge accumulation section 52 in the depth direction (a thickness direction) of the substrate 12. In other words, the second charge accumulation section 25 is formed on a front surface side of the first charge accumulation section 52 in the depth direction of the substrate 12. At this time, the n-type semiconductor layer configuring the first charge accumulation section 52 and the n-type semiconductor layer configuring the second charge accumulation section 25 are so arranged as to be electrically isolated from each other with the p-type well region 13 in between.

Moreover, to achieve more complete reading of a signal charge from the first charge accumulation section 52 to the second charge accumulation section 25 (i.e., to reduce a residual signal charge after transfer), an impurity concentration of the second charge accumulation section 25 may be preferably higher than that of the first charge accumulation section 52.

Further, a thin p-type semiconductor layer 26 is formed closer to the front surface side than the n-type semiconductor layer configuring the second charge accumulation section 25 to be in contact with the second charge accumulation section 25. The generation of a dark current caused at an interface between an oxide film configuring a wiring layer (not illustrated) formed on the front surface side of the substrate 12 and the substrate is allowed to be suppressed by the p-type semiconductor layer 26.

It is to be noted that, in FIG. 2, the second charge accumulation section 25 and the p-type semiconductor layer 26 are formed on the right side of each of two pixels and the left side of each of two pixels. These layers 25 and 26 are formed at the entire periphery of each pixel, and portions where these layers 25 and 26 are formed on the right side and the left side of the pixel are connected to each other in positions not illustrated in FIG. 2 to form one unit.

The floating diffusion section 34 is formed on the front surface side of the substrate 12. The floating diffusion section 34 is configured of a highly concentrated n-type semiconductor layer.

In addition, a source-drain region configuring each pixel transistor is formed on the front surface side of the substrate 12. In FIG. 2, drains 35 and 29 configuring the first reset transistor Tr3 and the second reset transistor Tr4, respectively, are illustrated as representatives.

The source-drain region configuring each pixel transistor is configured of a highly concentrated n-type semiconductor layer as with the floating diffusion section 34. The floating diffusion section 34 and the source-drain regions configuring respective pixel transistors are formed in positions overlapping the first charge accumulation section 52 in the depth direction of the substrate 12, and are so formed as not to connect the n-type semiconductor layers to one another by the p-type well region 13.

The first transfer transistor Tr1 is configured of the first charge accumulation section 52 serving as a source, the second charge accumulation section 25 serving as a drain, and a first transfer gate electrode 27. The first transfer gate electrode 27 configuring the first transfer transistor Tr1 is a vertical gate electrode formed from the front surface side of the substrate 12 in the depth direction, and is formed at a depth that passes through the second charge accumulation section 25 to reach the first charge accumulation section 52. The first transfer gate electrode 27 is formed by embedding an electrode material in a trench section formed from the substrate 12 to a desired depth with a gate insulating film 28 in between.

It is to be noted that, although not illustrated in FIG. 2, in a case where the first transfer gate electrode 27 is formed, a thin p-type semiconductor layer may be formed on a side surface and a bottom surface of a trench. A dark current generated at an interface between the trench section and the substrate 12 is allowed to be suppressed by forming the thin p-type semiconductor layer on the side surface and the bottom surface of the trench.

Then, as illustrated in FIG. 3, a wiring line that supplies a first transfer pulse φTRG1 is connected to the first transfer gate electrode 27. In the first transfer transistor Tr1, a signal charge accumulated in the first charge accumulation section 52 is allowed to be read to the second charge accumulation section 25 by applying a desired first transfer pulse φTRG1 to the first transfer gate electrode 27. In this case, a channel is formed along the first transfer gate electrode 27, and the signal charge moves to the second charge accumulation section 25 along the first transfer gate electrode 27.

The second transfer transistor Tr2 is configured of the second charge accumulation section 25 serving as a source, the floating diffusion section 34 serving as a drain, and a second transfer gate electrode 32. The second transfer gate electrode 32 configuring the second transfer transistor Tr2 is formed on the front surface of the substrate 12 between the source and the drain with a gate electrode 28 made of, for example, a silicon oxide film in between.

Then, as illustrated in FIG. 3, a wiring line that supplies a second transfer pulse φTRG2 is connected to the second transfer gate electrode 32. In the second transfer transistor Tr2, a signal charge accumulated in the second charge accumulation section 25 is allowed to be read to the floating diffusion section 34 by applying a desired second transfer pulse φTRG2 to the second transfer gate electrode 32.

The first reset transistor Tr3 is configured of the floating diffusion section 34 serving as a source, the drain (reset section) 35 connected to a power supply voltage Vdd, and a first reset gate electrode 33. The first reset gate electrode 33 configuring the first reset transistor Tr3 is formed on the front surface of the substrate 12 between the source and the drain with a gate insulating film 28 made of, for example, a silicon oxide film in between.

Then, as illustrated in FIG. 3, a wiring line that supplies a first reset pulse φRST1 is connected to the first reset gate electrode 33. In the first reset transistor Tr3, a potential of the floating diffusion section 34 is reset to the power supply voltage Vdd by applying a desired first reset pulse φRST1 to the first reset gate electrode 33.

The second reset transistor Tr4 is configured of the first charge accumulation section 52 serving as a source, the drain (discharge section) 29 connected to the power supply voltage Vdd, and a second reset gate electrode 30. The second reset gate electrode 30 configuring the second reset transistor Tr4 is a vertical gate electrode formed from the front surface side of the substrate 12 in the depth direction, and is formed at a depth that passes through the drain 29 to reach the first charge accumulation section 52. The second reset gate electrode 30 is formed by embedding an electrode material in a trench section formed from the front surface side of the substrate 12 to a desired depth with the gate insulating film 28 in between.

Then, as illustrated in FIG. 3, a wiring line that supplies a second reset pulse φRST2 is connected to the second reset gate electrode 30. In the second reset transistor Tr4, a potential of the second charge accumulation section 25 is reset to the power supply potential Vdd by applying a desired second reset pulse φRST2 to the second reset gate electrode 30. In this case, a channel is formed along the second reset gate electrode 30, and a signal charge is discharged to the drain (discharge section) 29 along the second reset gate electrode 30.

The amplification transistor Tr5 is configured of a drain connected to the power supply voltage Vdd, a source doubling as a drain of the selection transistor Tr6, and an amplification gate electrode 45. As illustrated in FIG. 3, the amplification gate electrode 45 between the source and the drain of the amplification transistor Tr5 is connected to the floating diffusion section 34.

This amplification transistor Tr5 configures a source follower circuit having the power supply voltage Vdd as a load, and a pixel signal according to a potential change in the floating diffusion section 34 is output from the amplification transistor Tr5.

The selection transistor Tr6 is configured of a drain doubling as the source of the amplification transistor Tr5, a source connected to the vertical signal line 9, and a selection gate electrode 46. As illustrated in FIG. 3, a wiring line that supplies a selection pulse φSEL is connected to the selection gate electrode 46 between the source and the drain of the selection transistor Tr6. A pixel signal amplified by the amplification transistor Tr5 is output to the vertical signal line 9 through the selection transistor Tr6 by supplying the selection pulse φSEL to the selection gate electrode 46 in each pixel.

It is to be noted that, in a sectional configuration illustrated in FIG. 2, circuit diagrams of the amplification transistor Tr5 and the selection transistor Tr6 are illustrated, and sectional configurations of them are not illustrated; however, in actuality, the amplification transistor Tr5 and the selection transistor Tr6 are formed in positions overlapping the first charge accumulation section 52 in the depth direction of the substrate 12. Moreover, the source-drain regions configuring the amplification transistor Tr5 and the selection transistor Tr6 may have, for example, a configuration similar to that of the source-drain regions configuring the first reset transistor Tr3.

Although not illustrated, a plurality of wiring layers laminated with an interlayer insulating film in between are formed on the front surface side of the substrate 12. A desired pulse is supplied to each of the pixel transistors through these wiring layers, and a signal charge of each pixel 2 is read thorough these wiring layers.

The photoelectric conversion section 50 is made of a photoelectric conversion material capable of generating a signal charge according to an amount of incident light, and is so formed on the back surface side of the substrate 12 as to be laminated, and is provided in the entire pixel region to coat a top surface of the first charge accumulation section 52 configured of the n-type semiconductor layer.

Moreover, the photoelectric conversion section 50 has a configuration doubling as a light-shielding film. In other words, the photoelectric conversion section 50 has a configuration in which photoelectric conversion is performed on light incident on the photoelectric conversion section 50 therein and the light is not incident on the substrate 12 side. Moreover, even in the photoelectric conversion section 50, a pixel isolation section (hereinafter referred to as "photoelectric conversion section-side pixel isolation section 51) is formed, and the photoelectric conversion section 50 is partitioned for each pixel.

As a material forming such a photoelectric conversion section 50, a compound semiconductor with a chalcopyrite structure is allowed to be used. For example, CuInSe$_2$ may be used.

Figure 4:
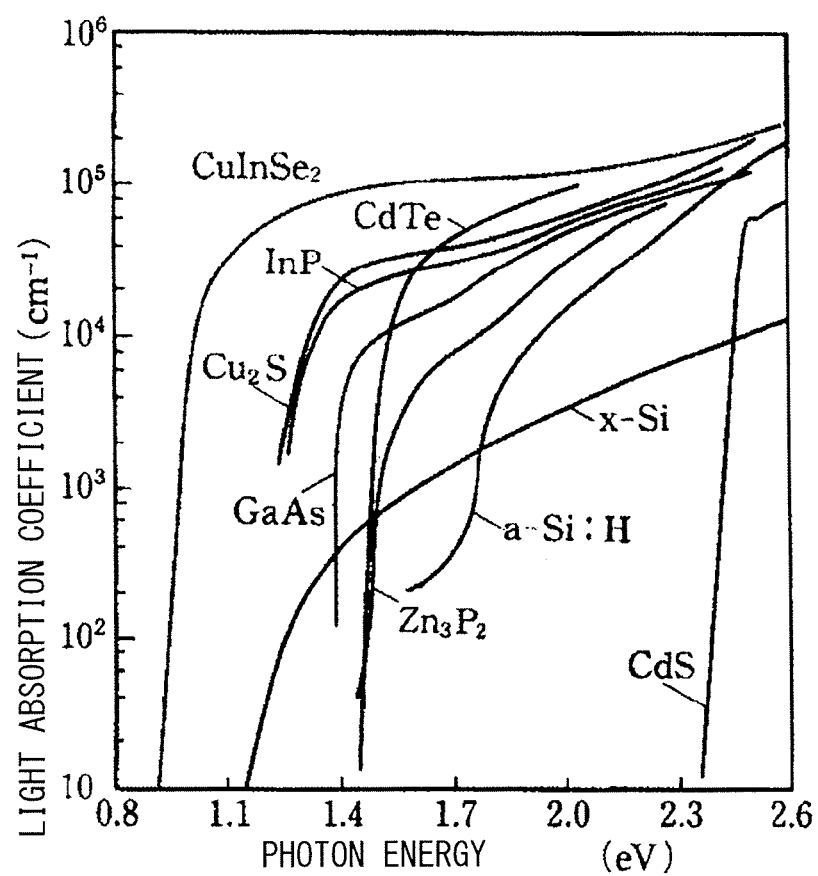
FIG. 4 is a diagram illustrating a relationship between photon energy and a light absorption coefficient in various semiconductor materials.

A relationship between photon energy and a light absorption coefficient in various semiconductor materials is illustrated in FIG. 4. As illustrated in FIG. 4, a light absorption coefficient of CuInSe$_2$ is higher than other materials, and in particular, the light absorption coefficient of CuInSe$_2$ is about two orders of magnitude higher than silicon single crystal (x-Si in FIG. 4). Therefore, the photoelectric conversion section made of CuInSe$_2$ may preferably carry out not only a function as the photoelectric conversion section but also a function of shielding visible light.

As long as a material used as the photoelectric conversion section 50 is a material having a higher absorption coefficient of a visible light beam than the substrate 12 made of silicon and developing a photoelectric conversion function, the material may have any one of a single crystalline structure, a polycrystalline structure, and an amorphous structure.

Moreover, as the chalcopyrite material configuring the photoelectric conversion section 50, chalcopyrite materials other than CuInSe$_2$ may be used. The other chalcopyrite materials have a high absorption coefficient as with CuInSe$_2$; therefore, even if the other chalcopyrite materials are used, the photoelectric conversion section is allowed to double as a light-shielding section. For example, a photoelectric conversion film made of a chalcopyrite-based compound semiconductor of a copper-aluminum-silver-gallium-indium-sulfur-selenium (CuAlAgGaInSSe)-based mixed crystal or a copper-aluminum-silver-gallium-indium-zinc-sulfur-selenium (CuAlAgGaInZnSSe)-based mixed crystal, or the like may be adopted.

At this time, to reduce crystal defects, a photoelectric conversion film of the photoelectric conversion section 50 may be desirably lattice-matched to the substrate.

Figure 5:
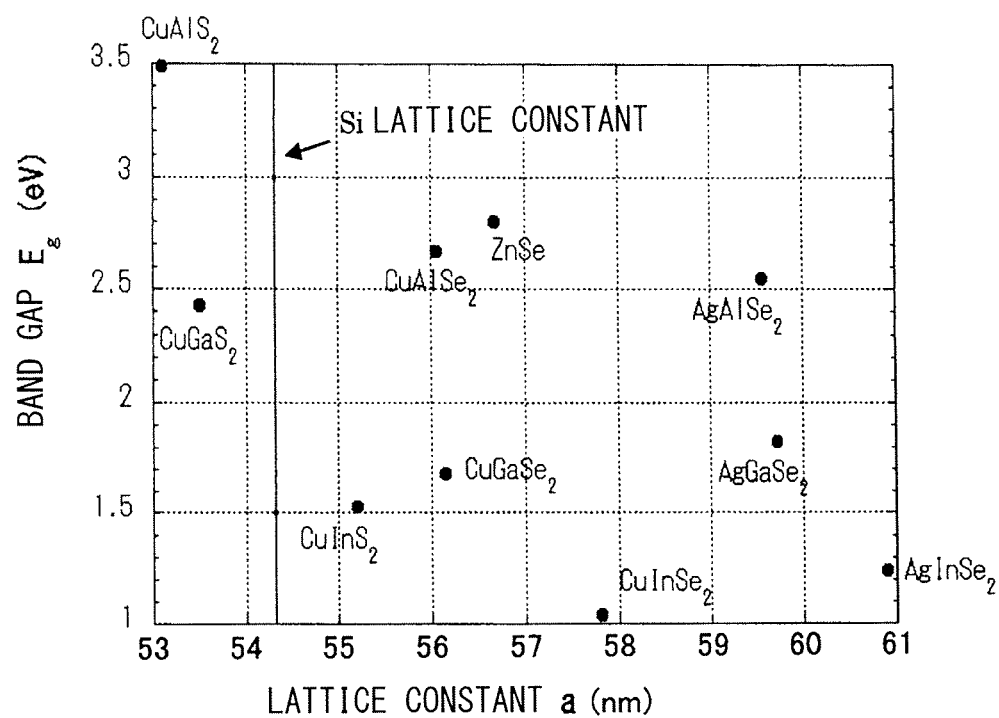
FIG. 5 is a diagram (No. 1) illustrating a relationship between lattice constants and band gaps of chalcopyrite materials.
Figure 6:
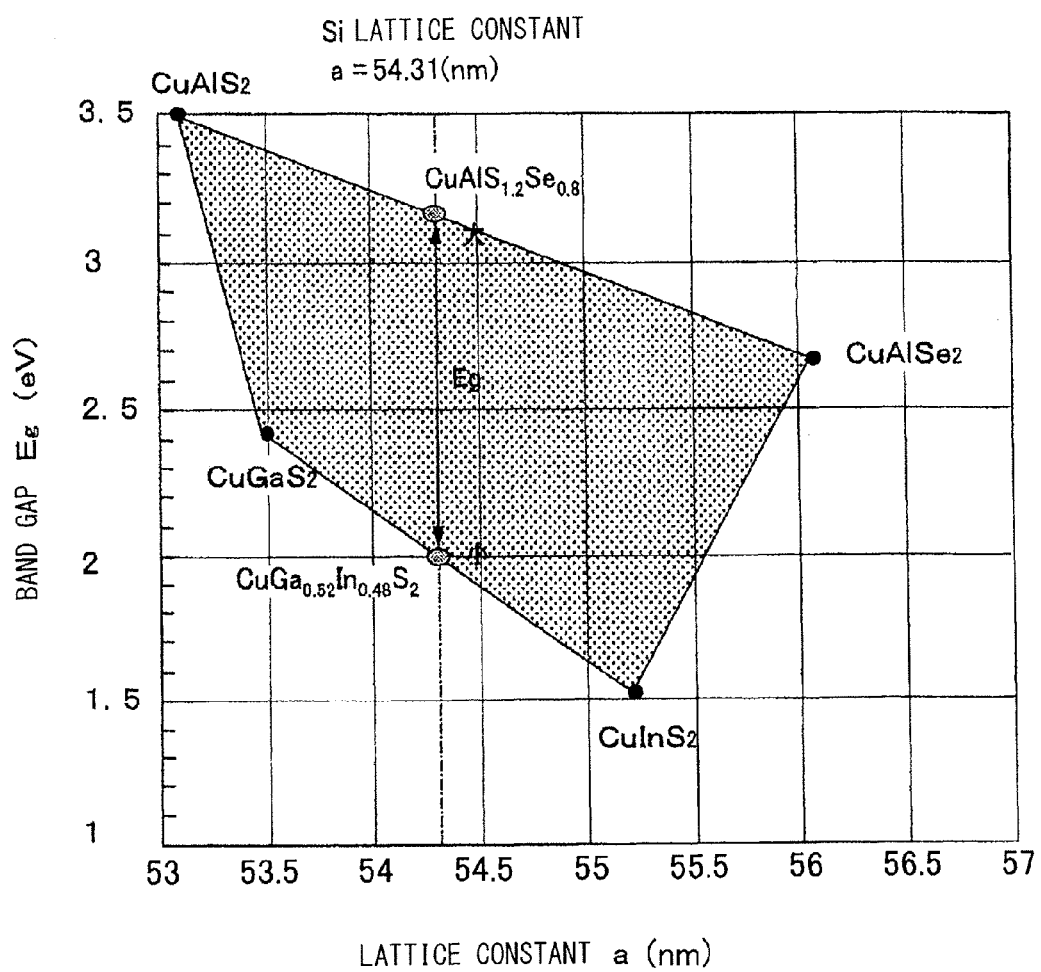
FIG. 6 is a diagram (No. 2) illustrating a relationship between lattice constants and band gaps of chalcopyrite materials.

FIG. 5 and FIG. 6 illustrate a relationship between a lattice constant and a band gap in the chalcopyrite materials. As illustrated in FIG. 5, there are various chalcopyrite materials.

In particular, as illustrated in FIG. 6, the composition of the CuAlGaInSSe-based mixed crystal is allowed to be controlled to be a heteroepitaxial crystal of which a lattice constant is lattice-matched to a lattice constant of 5.43 angstroms of silicon; therefore, crystal defects are allowed to be reduced.

Accordingly, the CuAlGaInSSe-based mixed crystal is allowed to be epitaxially grown as a single crystal thin film on the substrate 12 made of silicon, and crystal defects such as misfit dislocation caused at a hetero interface are allowed to be reduced.

Such crystal defects form a deep level in a band gap, and carriers such as electrons or holes caught at this level are discharged; therefore, the carriers cause a dark current (noise) being attached to a signal. In particular, at the deep level, a time constant until discharging the carriers is long; therefore, in practice, noise generation is an issue.

Accordingly, by reducing crystal defects by lattice-matched heteroepitaxy, the generation of the dark current is allowed to be suppressed to reduce noise.

Moreover, the chalcopyrite material configuring the photoelectric conversion section 50 may have any one of conductivity types, i.e., a p type, an n type, and an i type. However, an impurity concentration may be preferably so changed as to change a potential in the photoelectric conversion section 50, thereby moving a signal charge generated by the photoelectric conversion section 50 to the first charge accumulation section 52 side. In a case where an electron is used as a signal charge, as with this embodiment, the signal charge generated by the photoelectric conversion section 50 moves along a potential gradient and is accumulated in the first charge accumulation section 52 by configuring the photoelectric conversion section 50 to increase a potential toward the substrate 12.

Figure 7:
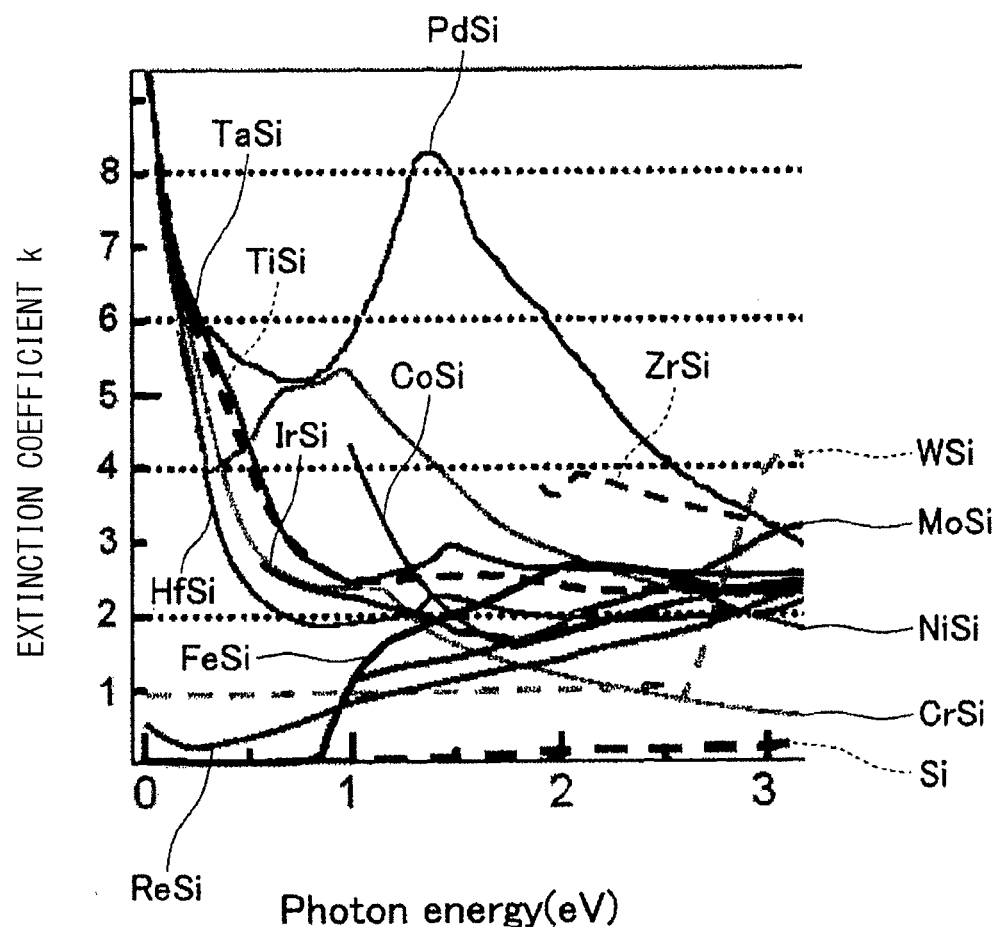
FIG. 7 is a diagram illustrating a relationship between photon energy and an extinction coefficient k in various silicide-based materials.

As another material configuring the photoelectric conversion section 50, a silicide-based material may be used. A relationship between photon energy and an extinction coefficient k in various silicide-based materials is illustrated in FIG. 7.

A light absorption coefficient α exhibits a relationship of $\alpha=4\pi k/\lambda$, with respect to the extinction coefficient k and a wavelength λ. Therefore, as can be seen from FIG. 7, silicide-based materials such as CoSi, CrSi, HfSi, IrSi, MoSi, NiSi, PdSi, ReSi, TaSi, TiSi, WSi, and ZrSi have a higher light absorption coefficient α than silicon.

In addition, a light absorption coefficient of a β-iron silicide material (β-FeSi$_2$) is two orders of magnitude higher than that of silicon (refer to H. Katsumata, et al., J. Appl. Phys. 8(10), 5995(1996)). Moreover, the β-iron silicide material (β-FeSi$_2$) is allowed to be epitaxially grown on a silicon substrate (refer to John E. Mahan, et al., Appl. Phys. Lett. 56(21), 2126(1990)). Therefore, the photoelectric conversion section 50 developing both the photoelectric conversion function and the light-shielding function is allowed to be formed with use of the β-iron silicide material (β-FeSi$_2$).

Moreover, absorption coefficients of a barium silicide-based material (BaSi$_2$) and Ba$_{1-x}$Sr$_x$Si$_2$ are about two orders of magnitude higher than that of silicon. Further, silicide-based materials such as SiGe, Mg$_2$SiGe, SrSi$_2$, MnSi$_{1.7}$, CrSi$_2$, a NiSi base, a CuSi base, a CoSi base, and a PtSi base also have a high absorption coefficient. Therefore, the photoelectric conversion section 50 also functioning as a light-shielding film is allowed to be formed with use of the silicide-based material.

In addition, inorganic materials such as FeS$_2$, CdTe, and CuS have a high absorption coefficient, and may be suitable as the material of the photoelectric conversion section 50.

Moreover, in addition to the above-described inorganic materials, the photoelectric conversion section 50 is allowed to be formed with use of an organic material. The organic material also has a high absorption coefficient, and may serve as a material used for both light-shielding and photoelectric conversion.

For example, some of organic materials including a quinacridone-based pigment or a coumarin-based pigment, and other organic materials are organic materials having an absorption coefficient two or more orders of magnitude higher than that of silicon. The photoelectric conversion section 50 is allowed to double as the light-shielding section by forming the photoelectric conversion section 50 of these organic materials.

It is to be noted that, in this embodiment, the color filter layer 23 is provided on the light incident side of the photoelectric conversion section 50; therefore, in a case where the photoelectric conversion section 50 is made of the organic material, a material having sensitivity in an entire visible light region may be used. Moreover, in each pixel, the photoelectric conversion section 50 may be configured to absorb light of a wavelength corresponding to a wavelength of light passing through the color filter layer 23.

Incidentally, the organic material is a material with low electron mobility. Therefore, in a case where the photoelectric conversion section 50 is configured with use of the organic material, the photoelectric conversion section-side pixel isolation section 51 that isolates the photoelectric conversion sections 50 of the respective pixels from one another may not be formed. Further, in a case where the photoelectric conversion section 50 is configured with use of the organic material, the photoelectric conversion section 50 may be formed by coating the substrate 12 with the organic material.

The p-type semiconductor layer 58 is formed on a side closer to the transparent electrode 57 of the photoelectric conversion section 50.

This p-type semiconductor layer 58 has a high impurity concentration to allow holes generated in the photoelectric conversion section 50 to enter the p-type semiconductor layer 58 and flow in a lateral direction (a direction along a film surface of the photoelectric conversion section 50).

The generation of a dark current is suppressed by forming the highly concentrated p-type semiconductor layer 58 on a surface on the light incident side of the photoelectric conversion section 50.

Moreover, the p-type semiconductor layers 58 of respective pixels are formed to be connected to one another with the p-type semiconductor layer configuring the photoelectric conversion section-side pixel isolation section 51 in between. Therefore, a signal charge (electrons) generated by the photoelectric conversion section 50 is allowed to flow toward the substrate 12 side, and holes are allowed to move from the photoelectric conversion section 50 to the p-type semiconductor layer 58 and move along the lateral direction on the photoelectric conversion section 50.

The transparent electrode 57 is formed on the light incident surface side above the photoelectric conversion section 50, and is formed in the entire pixel region. The transparent electrode 57 is formed of an electrode material having light transparency to wavelengths in a visible light region, and may be configured of, for example, a transparent conductive film such as an indium tin oxide (ITO) film, an indium zinc oxide film, an aluminum zinc oxide (AZO) film, or a zinc oxide film.

This transparent electrode 57 is grounded to a ground potential, and is configured to prevent charge by hole accumulation.

Moreover, a signal charge generated by the photoelectric conversion section 50 is allowed to be collected into the first charge accumulation section 52 by an external electric field by the transparent electrode 57.

Thus, in this embodiment, the first charge accumulation section 52 configured of the n-type semiconductor layer is formed below the photoelectric conversion section 50, and the transparent electrode 57 grounded to the ground potential is formed above the photoelectric conversion section 50. Therefore, in the photoelectric conversion section 50, a signal charge (electrons) generated according to the amount of incident light moves toward the first charge accumulation section 52 side, and holes generated together with the generation of the signal charge move toward the transparent electrode 57 side.

The color filter layer 23 is formed above the photoelectric conversion section 50, and filter layers allowing light of R (red), G (green), and B (blue) to selectively pass therethrough are arranged for respective pixels. Moreover, these filter layers may be arranged in a Bayer arrangement for respective pixels.

Light of a desired wavelength passes through the color filter layer 23, and light having passed through the color filter layer 23 enters the photoelectric section 50 on the substrate 12.

It is to be noted that, in this embodiment, each pixel has a configuration in which light of one of R, G, and B passes therethrough; however, this embodiment is not limited thereto. As a material forming the color filter layer 23, an organic material allowing light of cyan, yellow, magenta, or the like to pass therethrough may be used, and a selection is allowed to be made from various materials according to specifications.

The on-chip lens 24 is formed above the color filter layer 23, and is formed for each pixel. In the on-chip lens 24, incident light is condensed, and the condensed light efficiently enters the photoelectric conversion section 50 through the color filter layer 23. It is to be noted that, in this embodiment, the on-chip lens 24 has a configuration in which incident light is condensed on a central position of the photoelectric conversion section 50.

In the solid-state image pickup unit 1 of this embodiment, specifically the second charge accumulation section 25 and the floating diffusion section 34 are formed in an peripheral portion of the pixel on the front surface side of the substrate 12.

On the other hand, the drain (reset section) 35 of the first reset transistor Tr3 and the drain (discharge section) 29 of the second reset transistor Tr4 are formed in a central portion of the pixel on the front surface side of the substrate 12.

Most of incident light is condensed on the central portion of the pixel by being condensed by the on-chip lens 24.

The discharge section 29, the reset section 35, and the like are arranged in the central portion of the pixel, and the second charge accumulation section (accumulation section) 25, the floating diffusion section 34, the amplification transistor Tr5, the selection transistor Tr6, and the like are arranged at the periphery of the central portion of the pixel. Therefore, an adverse effect of smear noise generated in a global shutter operation is allowed to be reduced.

In other words, when light enters the second charge accumulation section (accumulation section) 25, the floating diffusion section 34, and the like, the light causes smear noise; however, even if light enters the discharge section 29, the reset section 35, and the like, the effect of the light on smear noise is small.

Figure 8:
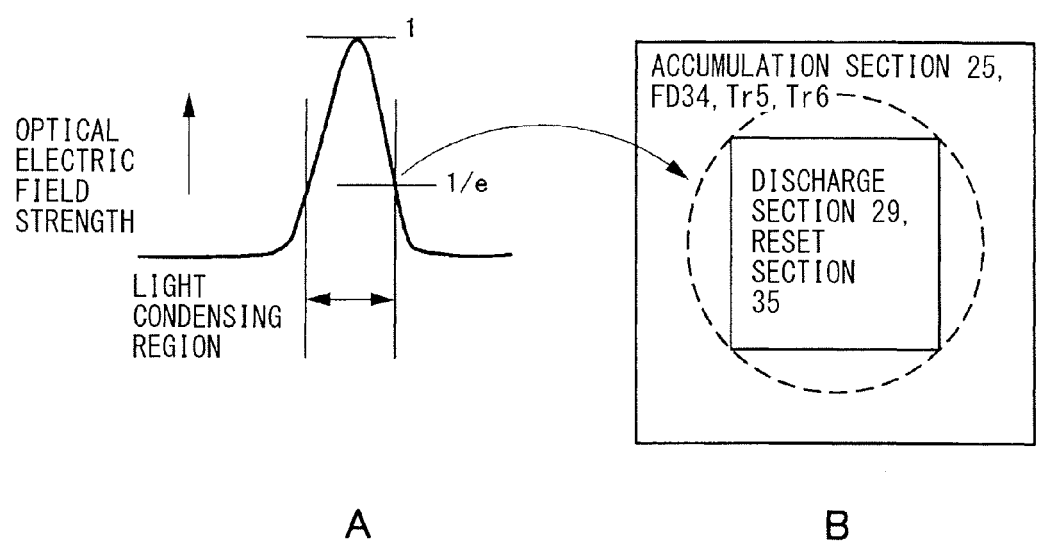
FIGS. 8 A and B in FIG. 8 are diagrams describing layout of respective components in the pixel.

Now, a relationship between a position in a horizontal direction of the pixel and optical electric field strength is illustrated in A of FIG. 8, and a schematic diagram of a planar arrangement in the pixel on the front surface side of the substrate is illustrated in B of FIG. 8.

As illustrated in A of FIG. 8, the optical electric field strength of light condensing on the on-chip lens 24 is highest in the central portion and smaller at the periphery of the central portion. A region with an optical electric field strength in a range from a maximum strength of 1 to a strength of 1/e is considered as a light condensing region.

Moreover, as illustrated in B of FIG. 8, the discharge section 29 and the reset section 35 are arranged in the central portion of the pixel, and the accumulation section 25, the floating diffusion section (FD) 34, the amplification transistor Tr5, and the selection transistor Tr6 are arranged in the peripheral portion of the pixel.

Further, the light condensing region (with a strength from 1/e to 1) in A of FIG. 8 is indicated by a broken line in B of FIG. 8.

Then, as illustrated in B of FIG. 8, smear noise is allowed to be effectively reduced by placing the discharge section 29, the reset section 35, and the like in a region enclosed by the broken line indicating the light-condensing region.

It is to be noted that more light obliquely enter pixels in an end portion of the pixel region 3; therefore, as with an existing solid-state image pickup unit, appropriate pupil correction may be desirably performed to allow the above-described light condensing region to be located in the central portion of each pixel.

Now, a state in which light is transmitted in the solid-state image pickup unit 1 of this embodiment was simulated.

Figure 9:
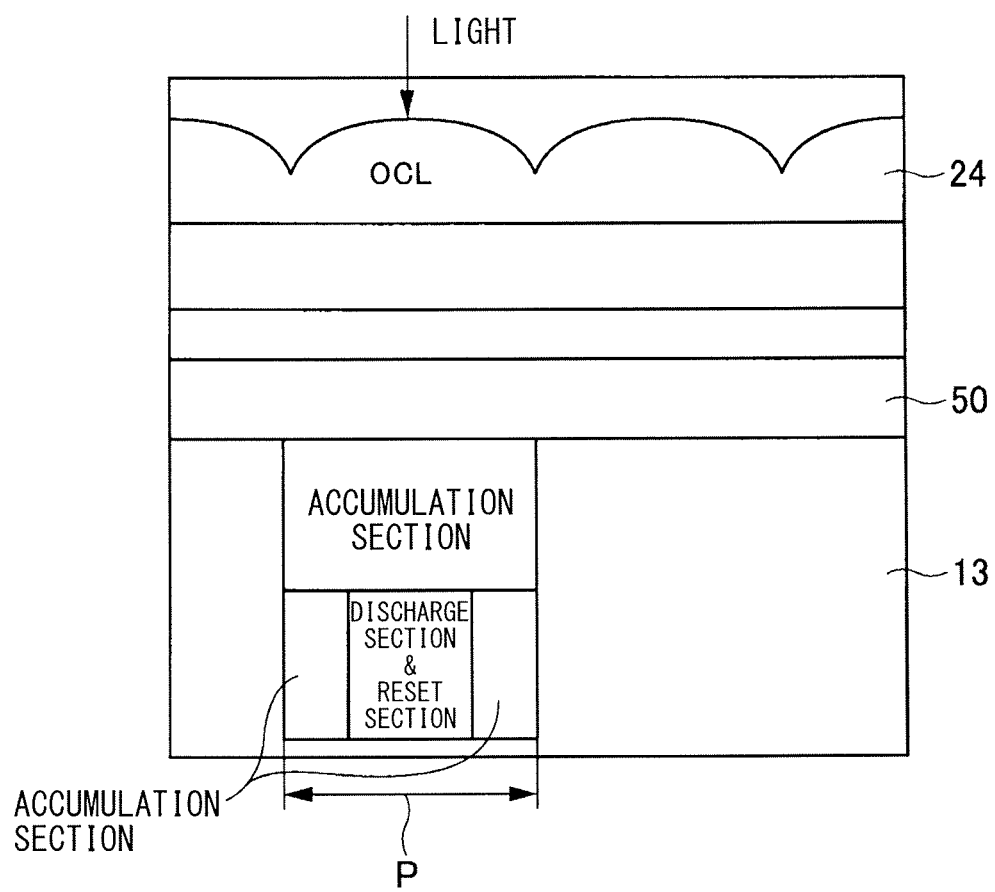
FIG. 9 is a diagram illustrating a configuration of a solid-state image pickup unit subjected to a simulation.

The solid-state image pickup unit 1 was a solid-state image pickup unit with a configuration illustrated in FIG. 9 formed by simplifying the configuration illustrated in FIG. 2.

More specifically, respective components in the substrate 12 were collectively partitioned into two vertically arranged regions, and an upper region of the two regions served as an integration section, and a lower region of the two regions served as an accumulation section and a discharge section-reset section. The accumulation section is arranged in the peripheral portion of the pixel, and the discharge section and the reset section are arranged in the central portion of the pixel.

In the solid-state image pickup unit with the configuration illustrated in FIG. 9, a pixel size P was 1.75 µm, the photoelectric conversion section was configured of a CuInGaS2 film with a thickness of 0.75 µm, a thickness of the integration section in the substrate 12 was 1.5 µm, and thicknesses of the accumulation section and the discharge section-reset section were 1.5 µm. Moreover, a thickness of an on-chip lens OCL was 500 nm. Then, a state in which light was transmitted in a case where light of a wavelength of 600 nm was incident in a vertical direction was simulated.

Figure 10:
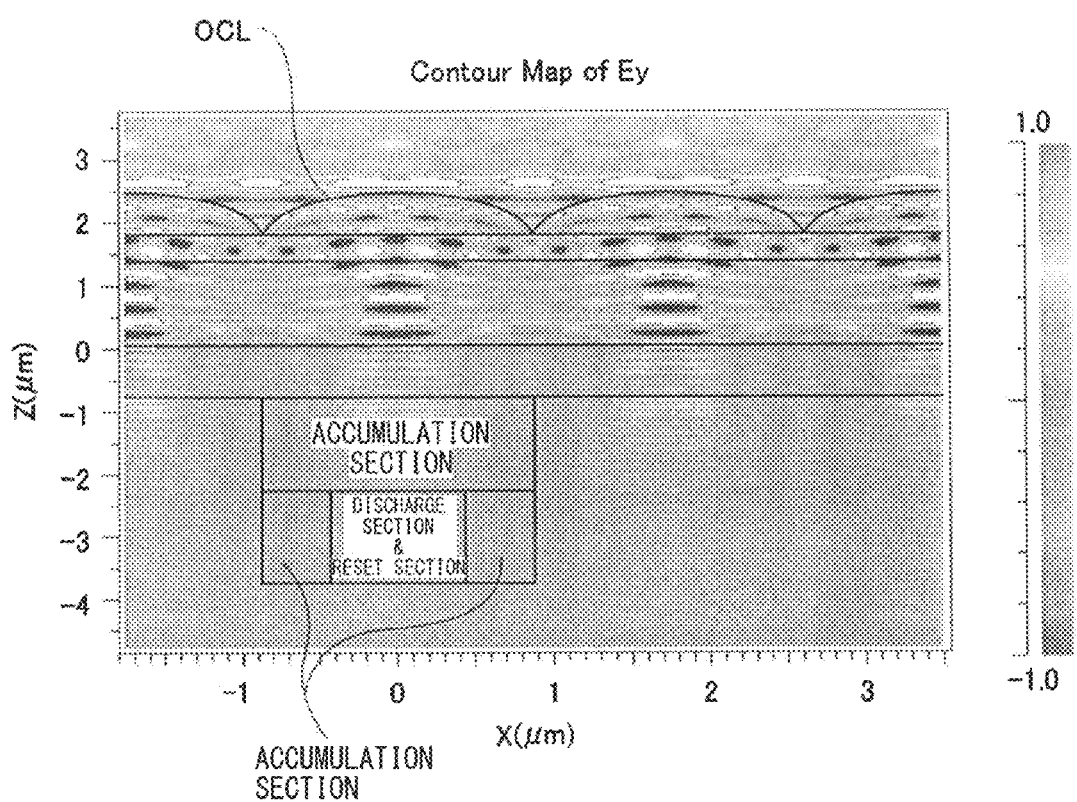
FIG. 10 is a diagram illustrating a result of simulating light transmission in the solid-state image pickup unit with the configuration in FIG. 9.

A result of simulation of the solid-state image pickup unit with the configuration illustrated in FIG. 9 is illustrated in FIG. 10.

As can be seen from FIG. 10, light was concentrated onto the discharge section-reset section in the central portion of the pixel, and the light hardly entered the accumulation section.

Then, it was found that, compared to a case where the accumulation section was arranged in the central portion of the pixel, an absorption amount in the accumulation section was reduced to 1/6 by arranging the accumulation section in the peripheral portion of the pixel. This is suggested that there is an effect of reducing smear noise by about −16 dB.

More specifically, the solid-state image pickup unit 1 of this embodiment is allowed to have, for example, a configuration in which the photoelectric conversion section 50 made of a CuAlGaInSSe-based mixed crystal lattice-matched to the n-type silicon region of the substrate 12 is formed with a thickness of 1000 nm and the transparent electrode 57 is formed with a thickness of 100 nm.

In the solid-state image pickup unit 1 of this embodiment, photoelectric conversion is performed on incident light in the photoelectric conversion section 50, and a signal charge according to the incident light is generated by the photoelectric conversion section 50. The generated signal charge moves into the substrate 12, and is accumulated in the first charge accumulation section 52.

The signal charges accumulated in the first charge accumulation sections 52 in all of the pixels are simultaneously transferred to the second charge accumulation sections 25, and are transferred to the floating diffusion section 34 from one row to another.

This driving method will be described in detail later.

In the solid-state image pickup unit 1 of this embodiment, the first charge accumulation section 52, and the second charge accumulation section 25 that temporarily holds the signal charge are so formed as to be laminated in the depth direction of the substrate 12. Therefore, the pixel area is allowed to be reduced, and miniaturization of pixels is achievable.

Moreover, the signal charge accumulated in the first charge accumulation section 52 is allowed to be read by the first transfer transistor Tr1 configured of a vertical transistor. Since the vertical transistor reads the signal charge in the depth direction of the substrate 12, compared to a configuration, such as a typical planar transistor, in which the signal charge is read in a horizontal direction of the substrate 12, an occupation area is small. Therefore, further miniaturization of pixels is achievable.

Moreover, in the solid-state image pickup unit 1 of this embodiment, the first charge accumulation section 52 and the second charge accumulation section 25 are laminated in the depth direction of the substrate 12, and the signal charge of the first charge accumulation section 52 is transferred by the first transfer transistor Tr1 configured of the vertical transistor. Therefore, a position where the second charge accumulation section 25 is formed may be a position located in the peripheral portion of the pixel and overlapping the first charge accumulation section 52, and flexibility of layout of the pixel transistors is high. As described above, an adverse effect of smear noise generated in a global shutter operation is allowed to be reduced by forming the second charge accumulation section 25 in the peripheral portion of the pixel.

Further, in the solid-state image pickup unit 1 of this embodiment, the first charge accumulation section 52 and the semiconductor layers configuring respective pixel transistors are formed in positions overlapping each other in the depth direction of the substrate 12; therefore, the first charge accumulation section 52 is allowed to have a wider area. Therefore, an improvement in the saturation charge amount is allowed to be achieved.

More desirably, a light-shielding film may be formed above the first accumulation section 52, for example, between the transparent electrode 57 and the color filter layer 23.

(Driving Method)

Next, a method of driving the solid-state image pickup unit 1 of this embodiment will be described below.

Figure 11:
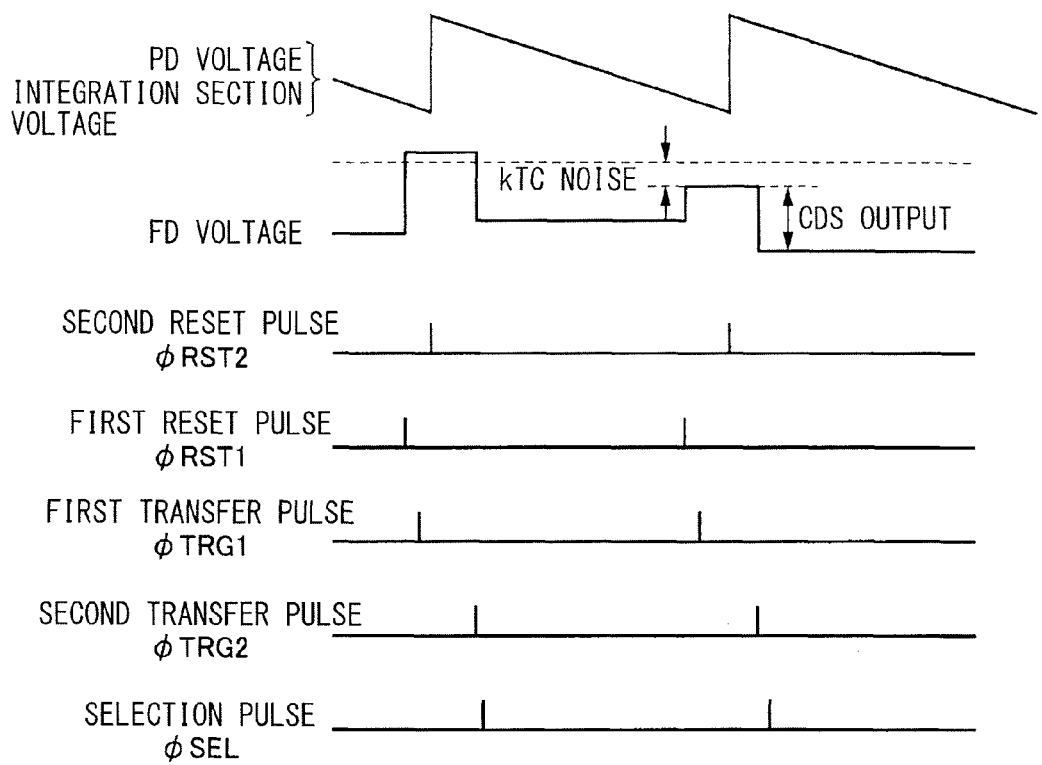
FIG. 11 is a timing chart of a method of driving the solid-state image pickup unit of the first embodiment.

A timing chart of the method of driving the solid-state image pickup unit 1 of this embodiment is illustrated in FIG. 11. Here, a timing of reading pixels belonging to an nth row will be described as an example.

Figure 12:
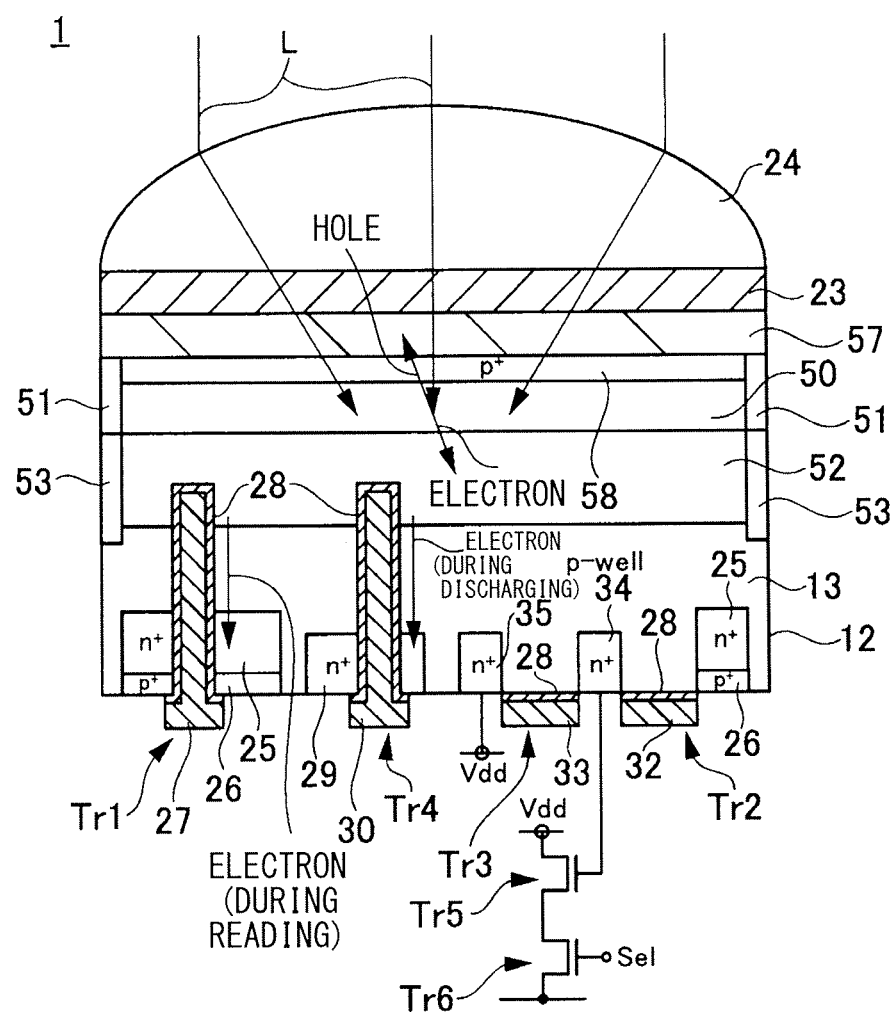
FIG. 12 is a diagram illustrating an operation of the solid-state image pickup unit of the first embodiment.

Moreover, an operation of the solid-state image pickup unit 1 of this embodiment is illustrated in a sectional view in FIG. 12.

First, supply of the first reset pulse $\phi$RST1 starts simultaneously in all of the pixels to turn on the first reset transistors Tr3. Accordingly, signal charges accumulated in the floating diffusion sections 34 are discharged to the power supply voltage Vdd side to reset the floating diffusion sections 34. In this case, the signal charge accumulated in the floating diffusion section 34 is a signal charge read from a previous frame.

After that, the supply of the first reset pulse $\phi$RST1 stops simultaneously in all of the pixels to turn off the second reset transistors Tr3.

Next, supply of the first transfer pulse $\phi$TRG1 starts simultaneously in all of the pixels to turn on the first transfer transistors Tr1. Accordingly, signal charges accumulated in the first charge accumulation sections 52 are transferred to the second charge accumulation sections 25.

After that, the supply of the first transfer pulse $\phi$TRG1 stops simultaneously in all of the pixels to turn off the first transfer transistors Tr1.

In this embodiment, the signal charges read by the second charge accumulation sections 25 simultaneously in all of the pixels are in a state in which the signal charges are held by the second charge accumulation sections 25 until reading on each row.

Next, supply of the second reset pulse $\phi$RST2 starts simultaneously in all of the pixels to turn on the second reset transistors Tr4. Accordingly, the signal charges remaining in the first charge accumulation sections 52 or the signal charges accumulated in a period from when the first transistors Tr1 are turned off to when the second reset transistors Tr4 are turned on are discharged to the power supply voltage Vdd side to be reset.

After that, when the supply of the second reset pulse $\phi$RST2 stops simultaneously in all of the pixels to turn off the second reset transistor Tr4, exposure in a next frame starts.

These operations so far are performed simultaneously in all of the pixels.

In this embodiment, global exposure starts by turning off the second reset transistors Tr4 simultaneously in all of the pixels, and the global exposure is terminated by turning on the first transfer transistors Tr1 simultaneously in all of the pixels. In other words, a period from when the second reset transistors Tr4 are turned off to when the first transistors Tr1 are turned on after that is considered as an exposure period. In the exposure period, a signal charge according to an amount of light incident on the photoelectric conversion section 50 is generated by the photoelectric conversion section 50. Then, the signal charge generated by the photoelectric conversion section 50 moves along a potential in the substrate 12 to be accumulated in the first charge accumulation section 52.

Next, reading starts from one row to another. In reading of the signal charge in the nth row, when the turn of operation in the nth row comes, the supply of the second transfer pulse $\phi$TRG2 starts to turn on the second transfer transistors Tr2. Accordingly, in the pixels belonging to the nth row, the signal charges accumulated in the second charge accumulation sections 25 are transferred to the floating diffusion sections 34.

After that, the supply of the second transfer pulse $\phi$TRG2 stops to turn off the second transfer transistors Tr2.

Next, supply of the selection pulse $\phi$SEL starts to turn on the selection transistors Tr6. Accordingly, an output corresponding to a potential of the floating diffusion section 34 is captured as a pixel signal by the column signal processing circuit 5 (refer to FIG. 1). In the column signal processing circuit 5, correlated double sampling is performed by obtaining a difference between a rest signal that has been captured previously and this pixel signal. Accordingly, in the column signal processing circuit 5, a pixel signal from which kTc noise is removed is obtained.

After that, the supply of the selection pulse $\phi$SEL stops to turn off the selection transistors Tr6, and reading of the pixels belonging to the nth row is completed.

After the reading of the pixels belonging to the nth row is completed, reading of pixels belonging to an n+1th row is performed, and reading of pixels in all rows is sequentially performed.

Thus, the solid-state image pickup unit 1 of this embodiment is allowed to be driven.

In the solid-state image pickup unit 1 of this embodiment, as illustrated in FIG. 12, photoelectric conversion is performed on incident light L in the photoelectric conversion section 50, and a signal charge (electrons) generated in the photoelectric conversion section 50 moves to the first charge accumulation section 52 to be accumulated mainly in the first charge accumulation section 52. Moreover, holes generated in the photoelectric conversion section 50 move to the transparent electrode 57.

Then, in the exposure period, when the first transfer transistors Tr1 are turned on, the signal charges accumulated in the first charge accumulation sections 52 are transferred to the second charge accumulation sections 25 simultaneously in all of the pixels as indicated by an arrow in "electrons (during reading)" in FIG. 12. The signal charges transferred to the second charge accumulation sections 25 are accumulated in the second charge accumulation sections 25.

The signal charges accumulated in the second charge accumulation sections 25 are transferred to the floating diffusion sections 34 at a timing in each row.

Then, during reading, pixel signals corresponding to the amounts of the signal charges of the floating diffusion sections 34 are output to the vertical signal lines 9 through the selection transistors Tr6.

Moreover, during electron discharging, when the second reset transistors Tr4 are turned on, the signal charges of the first charge accumulation sections 52 are discharged to the drains (discharge sections) 29 of the second reset transistors Tr4 simultaneously in all of the pixels as indicated by an arrow in "electrons (during discharging)" of FIG. 12.

(Manufacturing Method)

Next, a method of manufacturing the solid-state image pickup unit 1 of this embodiment will be described below.

For example, the solid-state image pickup unit 1 of this embodiment is allowed to be manufactured as will be described below.

First, for example, the p-type well region 13 is formed in the n-type substrate 12 by ion-implanting a p-type impurity.

Figure 13A:
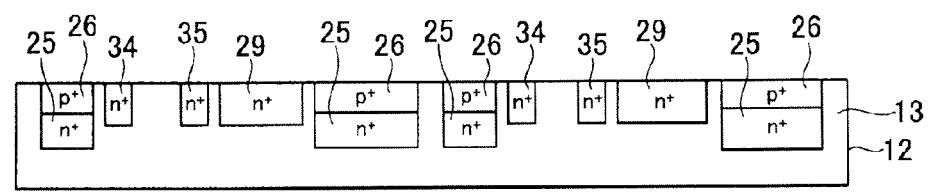
FIG. 13A is a manufacturing process diagram illustrating a method of manufacturing the solid-state image pickup unit of the first embodiment.

After that, as illustrated in FIG. 13A, the second charge accumulation section 25, the floating diffusion section 34, and the source-drain regions 29 and 35 of each pixel transistor are formed on the front surface side of the substrate 12 by ion-implanting P (phosphorus) or the like in Group V as an n-type dopant.

After that, the thin p-type semiconductor layer 26 is formed on the front surface side of the second charge accumulation section 25 by ion-implanting a p-type impurity at a high concentration.

These processes are allowed to be executed with use of a process of manufacturing a typical CMOS-type solid-state image pickup unit.

Next, a supporting substrate (not illustrated) made of silicon or the like is bonded to the front surface side of the substrate 12, and the substrate 12 is so flipped over as to turn the back surface side of the substrate 12 upward.

Figure 13B:
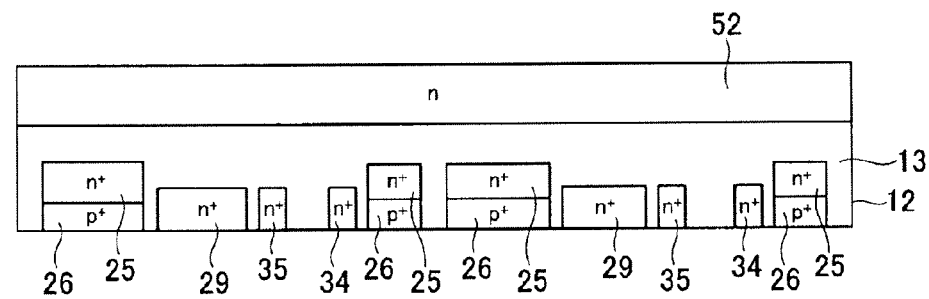
FIG. 13B is a diagram illustrating a process following FIG. 13A.

After that, as illustrated in FIG. 13B, an n-type semiconductor layer that is to be the first charge accumulation section 52 is epitaxially grown until a desired thickness on the back surface of the substrate 12 with use of, for example, a CVD method while being doped with an n-type impurity.

Figure 13C:
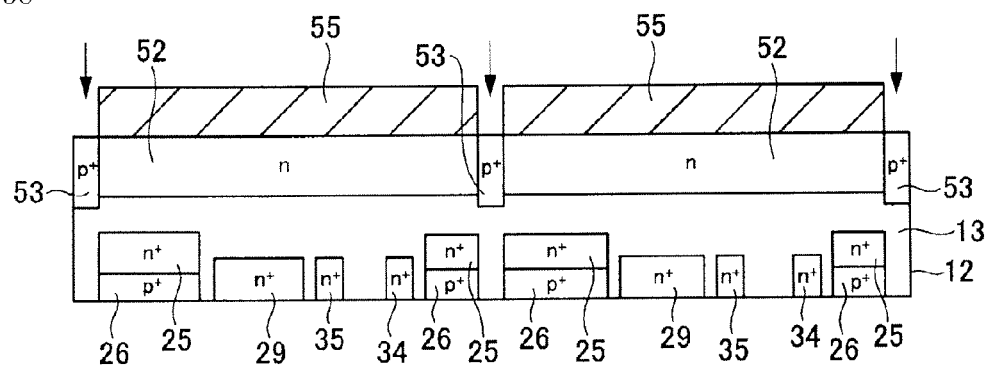
FIG. 13C is a diagram illustrating a process following FIG. 13B.

Next, as illustrated in FIG. 13C, a resist layer 55 in which an opening is formed in a region where the pixel isolation section 53 is to be formed above the n-type semiconductor layer of the first charge accumulation section 52. This resist layer 55 is allowed to be formed with use of a typical photolithography technique. Then, the pixel isolation section 53 is formed by ion-implanting the p-type impurity through the resist layer 55 so as to have, for example, a higher impurity concentration than a concentration of the impurity forming the p-type well region 13. The p-type semiconductor layer configuring the pixel isolation section 53 is formed at least at a depth at which the first charge accumulation section 52 is allowed to be partitioned for each pixel.

Figure 14D:
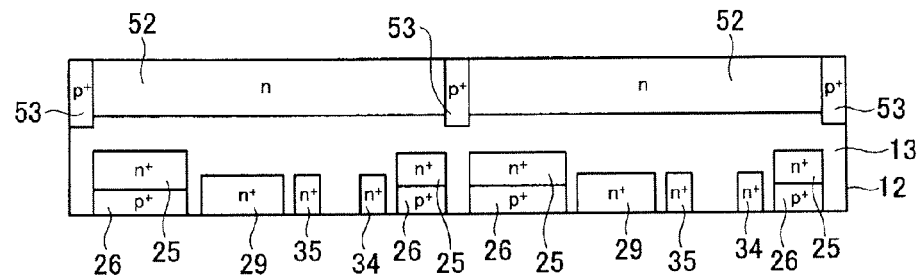
FIG. 14D is a diagram illustrating a process following FIG. 13C.

Next, as illustrated in FIG. 14D, the resist layer 55 on the first charge accumulation section 52 is removed.

Figure 14E:
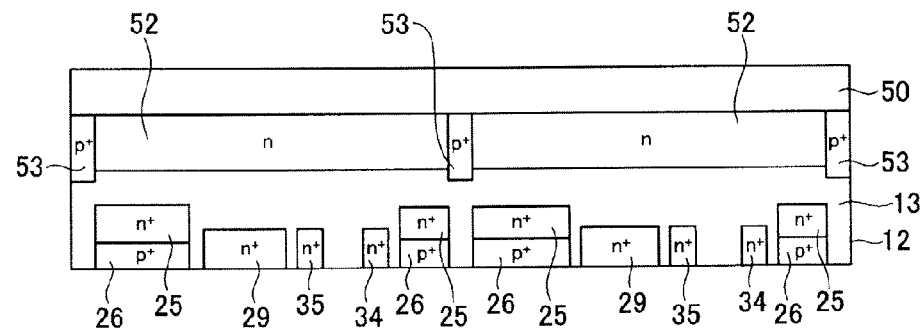
FIG. 14E is a diagram illustrating a process following FIG. 14D.

Then, as illustrated in FIG. 14E, the photoelectric conversion section 50 is formed by epitaxially growing, for example, a chalcopyrite-based material above the first charge accumulation section 52.

In this embodiment, as a method of epitaxially growing a chalcopyrite-based compound semiconductor, a molecular beam epitaxy (MBE) method, a metal organic chemical vapor deposition (MOCVD) method, or a liquid phase epitaxy (LPE) method is allowed to be used. It is to be noted that any film forming method may be basically used as long as the method achieves epitaxial growth.

Incidentally, a lattice constant of silicon forming the substrate 12 is 51.45 nm, and a CuAlGaInSSe-based mixed crystal includes a material corresponding to this lattice constant; therefore, the photoelectric conversion section 50 is allowed to be so formed as to be lattice-matched to the substrate 12. Therefore, for example, a CuGaInS film is allowed to be epitaxially grown on the substrate 12 as the photoelectric conversion section 50.

Figure 15:
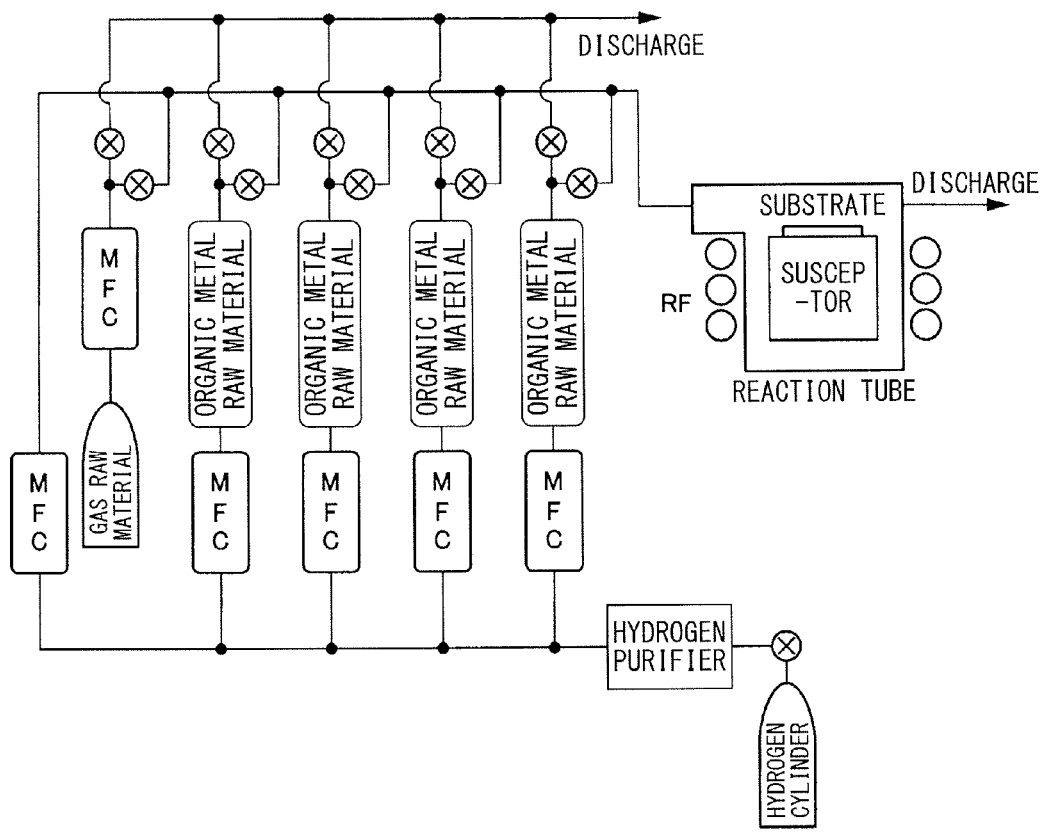
FIG. 15 is a diagram illustrating an MOCVD apparatus used for formation of a photoelectric conversion section.

In a case where the photoelectric conversion section 50 is formed with use of the MOCVD method, for example, a MOCVD apparatus illustrated in FIG. 15 is allowed to be used.

To grow the crystal of the photoelectric conversion section 50 on the substrate 12, as illustrated in FIG. 15, the substrate is placed on a susceptor (made of carbon). The susceptor is heated by a high-frequency heating device (an RF coil), and is provided with a thermocouple and a temperature control mechanism thereof so as to allow the temperature of the substrate 12 to be controlled. A typical substrate temperature is within a temperature range of 400 to 1000° C. in which thermal decomposition is possible; however, to reduce the substrate temperature, for example, light may be applied to a substrate surface with use of a mercury lamp or the like to assist thermal decomposition of a raw material.

Then, an organic metal raw material is bubbled with hydrogen to turn to a saturated vapor pressure state, thereby transporting respective raw material molecules to a reaction tube. In this case, a molar quantity ratio of each raw material transported per unit time is adjusted by controlling a flow rate of hydrogen flowing to the raw material by a mass flow controller (MFC). Thus, crystal growth occurs on the substrate 12 made of silicon by thermally decomposing the organic metal raw material to capture the decomposed organic metal raw material by a crystal; therefore, the photoelectric conversion section 50 is allowed to be formed. Since the molar quantity ratio of the raw material has correlativity with a composition ratio of a formed crystal, the composition ratio of the photoelectric conversion section 50 epitaxially grown is allowed to be controlled by controlling the molar quantity ratio of this raw material transported per unit time.

In a case where the photoelectric conversion section 50 is formed with use of the MOCVD method, as an organic metal raw material of copper, for example, acetylacetone copper ($Cu(C_5H_7O_2)_2$) may be used. In addition, cyclopentadienyl copper triethylphosphorus ($h5-(C_2H_5)Cu:P(C_2H_5)_3$) may be used. Moreover, as an organic metal raw material of gallium (Ga), for example, trimethylgallium ($Ga(CH_3)_3$) may be used. As an organic metal raw material of aluminum (Al), for example, trimethylaluminum ($Al(CH_3)_3$) may be used. Moreover, an organic metal raw material of indium (In), trimethylindium ($In(CH_3)_3$) may be used. Further, as an organic raw material of selenium (Se), for example, dimethylselenium ($Se(CH_3)_2$) may be used. Furthermore, as an organic metal raw material of sulfur (S), dimethyl sulfide ($S(CH_3)_2$) may be used. Moreover, as an organic raw material of zinc (Zn), for example, dimethylzinc ($Zn(CH_3)_2$) may be used.

It is to be noted that raw materials such as cyclopentadienyl copper triethylphosphorus ($h5-(C_2H_5)Cu:P(C_2H_5)_3$), acetylacetone copper ($Cu(C_5H_7O_2)_2$), and trimethylindium ($In(CH_3)_3$) are in a solid phase state at room temperature. In such a case, the raw materials may be heated to be turned to a liquid phase state, or the raw materials in the solid phase state may be simply heated to high temperature, and may be used in a a high-vapor-pressure state.

In this case, the organic metal raw material is not necessarily specified to these raw materials, and as long as the organic metal raw material is an organic metal, any organic metal raw material is allowed to be used as a raw material for MOCVD growth in a similar manner. For example, triethylgallium (Ga($C_2H_5$)$_3$), triethylaluminum (Al($C_2H_5$)$_3$), triethylindium (In($C_2H_5$)$_3$), diethylselenium (Se($C_2H_5$)$_2$), diethyl sulfide (S($C_2H_5$)$_2$), and diethylzinc (Zn($C_2H_5$)$_2$) may be used as raw materials.

Moreover, the raw material for MOCVD growth is not necessarily limited to the organic metal, and may be a gas-based raw material. For example, hydrogen selenide ($H_2Se$) may be used as the raw material of Se, and hydrogen sulfide ($H_2S$) may be used as the raw material of S.

Figure 16:
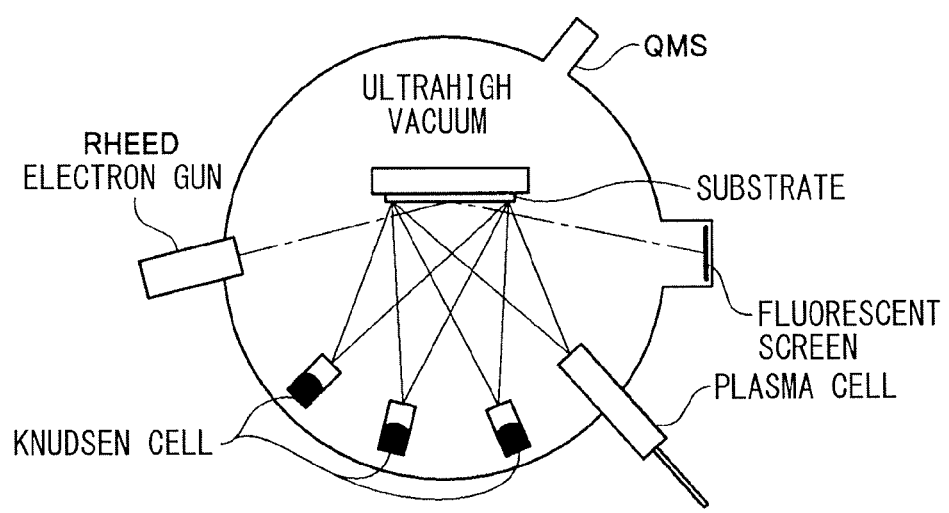
FIG. 16 is a diagram illustrating an MBE apparatus used for formation of the photoelectric conversion section.

In a case where the photoelectric conversion section 50 is formed with use of the MBE method, for example, an MBE apparatus illustrated in FIG. 16 may be used.

To form the photoelectric conversion section 50 with use of the MBE method, in the MBE apparatus illustrated in FIG. 16, respective simple-substance raw materials for configuring the photoelectric conversion section 50 are contained in respective Knudsen cells in a ultrahigh vacuum, and these raw materials are heated to an appropriate temperature. Accordingly, molecular beams are generated, and a desired crystal-grown layer is allowed to be formed by applying the molecular beams to the substrate 12. As the simple-substance raw materials contained in the Knudsen cells, gallium (Ga), aluminum (Al), indium (In), selenium (Se), and sulfur (S) are allowed to be used. At this time, in a case of a raw material with a specifically high vapor pressure such as sulfur (S), stability of molecular beam quantity may be poor. In this case, the molecular beam quantity may be stabilized with use of a valved cracking cell. Moreover, as in gas-source MBE, some of raw materials may be gas-source materials. In this case, for example, as the raw material of Se, hydrogen selenide ($H_2Se$) may be used, and as the raw material of sulfur (S), hydrogen sulfide ($H_2S$) may be used.

It is to be noted that, in a case where the photoelectric conversion section 50 is formed with use of the MOCVD method or the MBE method, for example, the photoelectric conversion section 50 in which a band is inclined in a crystal growth direction is allowed to be formed by gradually reducing the concentration of Zn as the n-type dopant during crystal growth. When the band in the photoelectric conversion section 50 is inclined in such a manner, the signal charge generated by the photoelectric conversion section 50 easily moves to the substrate 12 side.

Doping with the n-type dopant is not necessarily performed, and, for example, the band is allowed to be inclined by variation in concentration only by controlling the amounts of supplied Group III atoms and supplied Group I atoms.

Then, such a photoelectric conversion section 50 is so formed as to be lattice-matched on the substrate 12. In this case, misfit dislocation caused at a hetero interface is allowed to be reduced; therefore, crystallinity of the photoelectric conversion section 50 becomes favorable. Accordingly, since crystal defects are reduced, the generation of a dark current is allowed to be suppressed, and image quality degradation due to a white spot is preventable. Moreover, higher sensitivity is allowed to be achieved; therefore, even in a dark image pickup environment (for example, at nighttime), shooting with high image quality is achievable.

In this case, lattice mismatch is represented by $|\Delta a/a|$ (where $\Delta a$: a difference between the lattice constant of the photoelectric conversion section and a constant of the substrate, and a: a lattice constant of the substrate), and in a case where lattice match is achieved, $\Delta a/a=0$ is established. It is to be noted that, in this embodiment, a definition of "lattice match" encompasses a state close to lattice match under a condition that the thickness of the photoelectric conversion section 50 formed by crystal growth is equal to or smaller than a critical film thickness. In other words, as long as the thickness of the photoelectric conversion section 50 is equal to or smaller than the critical film thickness, even though lattice match is not perfectly achieved, a state in which crystallinity is favorable without misfit dislocation is achievable.

Moreover, a definition of "critical film thickness" is defined in "Matthew-Blakeslee model" (refer to J. W. Matthews and A. E. Blakeslee, J. Cryst. Growth 27 (1974) 118-125) or "People-Bean model" (refer to R. People and J. C. Bean, Appl. Phys. Lett. 47 (1985) 322-324).

Figure 14F:
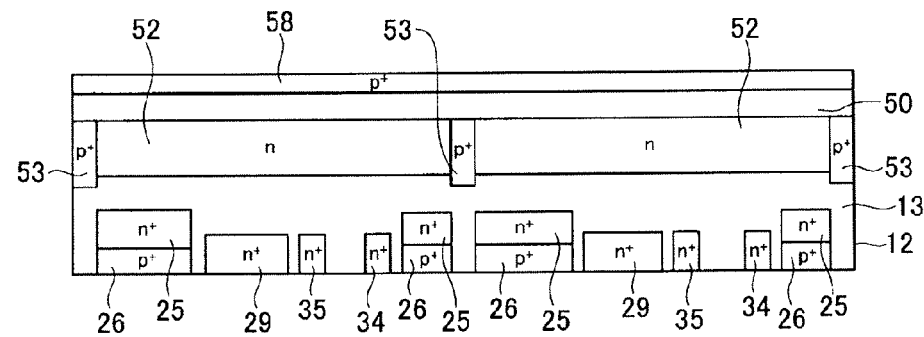
FIG. 14F is a diagram illustrating a process following FIG. 14E.

After the photoelectric conversion section 50 made of epitaxial crystal is formed in the above-described manner, as illustrated in FIG. 14F, a p-type impurity is injected into a top portion of the photoelectric conversion section 50 to form the p-type semiconductor layer 58.

Figure 14G:
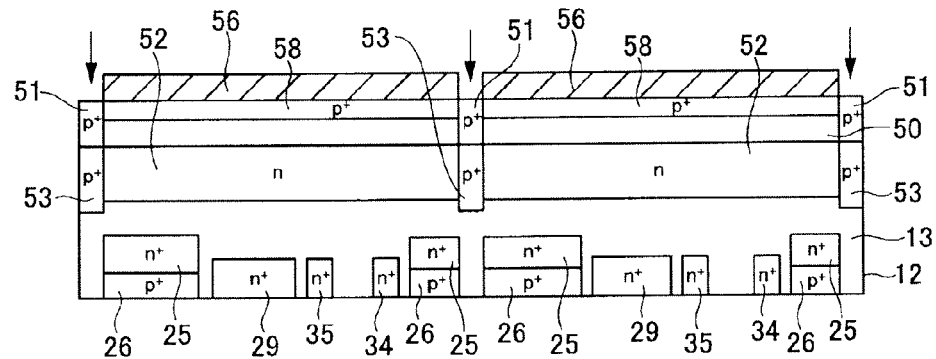
FIG. 14G is a diagram illustrating a process following FIG. 14F.

Next, as illustrated in FIG. 14G, a resist layer 56 in which an opening is formed in a region where the photoelectric conversion section-side pixel isolation section 51 is to be formed is formed above the p-type semiconductor layer 58. Then, the photoelectric conversion section-side pixel isolation section 51 that partitions the photoelectric conversion section 50 for each pixel is formed by ion-implanting Ga, In, As, or P as a p-type dopant with the resist layer 56 in between. Thus, the photoelectric conversion section-side pixel isolation section 51 is allowed to be formed to serve as a potential barrier between pixels by controlling a doping concentration in such a manner.

After that, the impurity of each semiconductor layer is activated, for example, by performing annealing treatment at 400° C. to 1000° C.

After that, each pixel transistor is formed on the front surface side of the substrate 12, and the transparent electrode 57, the color filter layer 23, and the on-chip lens 24 are formed on the back surface side of the substrate 12.

Thus, the solid-state image pickup unit of this embodiment is allowed to be manufactured.

The solid-state image pickup unit 1 of this embodiment may be manufactured by a method other than the above-described method.

Next, another method of manufacturing the solid-state image pickup unit 1 of this embodiment will be described below.

First, desired semiconductor layers are formed on the substrate 12 by processes similar to the processes illustrated in FIG. 13A to FIG. 14D.

Figure 17A:
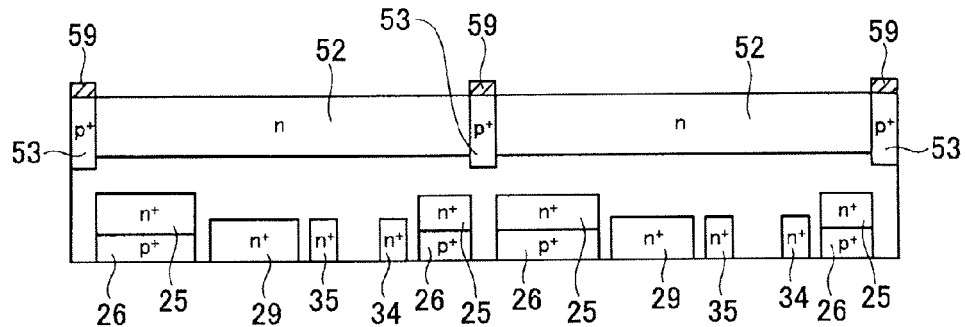
FIG. 17A is a manufacturing process diagram illustrating another method of manufacturing the solid-state image pickup unit of the first embodiment.

After that, as illustrated in FIG. 17A, the insulating film 59 is selectively formed only in a portion where the photoelectric conversion section-side pixel isolation section 51 is to be formed above the back surface where the first charge accumulation section 52 is formed of the substrate 12. In other words, the insulating film 59 is formed to isolate adjacent pixels from each other.

The insulating film 59 may be configured of, for example, a silicon oxide film or a silicon nitride film. In this embodiment, the photoelectric conversion section-side pixel isolation section 51 is formed in a same position as that of a pixel isolation section 20 formed on the substrate 12 side; therefore, the insulating film 59 is formed above the pixel isolation section 20 formed on the substrate 12 side. This insulating film 59 is allowed to be formed by forming, for example, a silicon oxide film on the entire back surface of the substrate 12, and then performing pattern processing with use of a photolithography technique, and a film thickness of the insulating film 59 may be, for example, 50 to 100 nm.

Figure 17B:
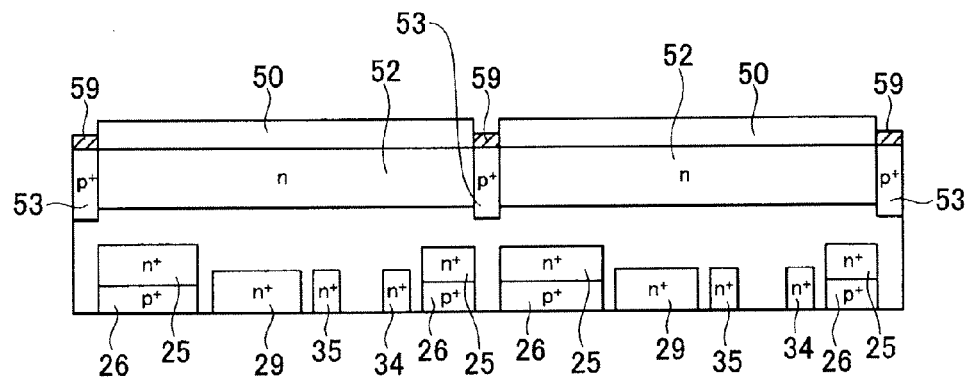
FIG. 17B is a diagram illustrating a process following FIG. 17A.

Next, as illustrated in FIG. 17B, the photoelectric conversion section 50 is formed by epitaxially growing the above-described compound semiconductor on the back surface side of the substrate 12 with use of the MOCVD method, the MBE method, or the like. In this manufacturing method, the insulating film 59 isolating the pixels from one another is formed on the back surface side of the substrate 12; therefore, the crystal of the photoelectric conversion section 50 selectively grows in an exposed portion where the insulating film 59 is not formed of the substrate 12 on the back surface side of the substrate 12. In this case, the photoelectric conversion section 50 is so formed as to have a larger film thickness than that of the insulating film 59. Accordingly, the photoelectric conversion section 50 is formed corresponding to each pixel, and a trench is provided between adjacent photoelectric conversion sections 50.

It is to be noted that, at this time, the photoelectric conversion section 50 in which the band is inclined in the crystal growth direction is allowed to be formed by gradually reducing the concentration of Zn as the n-type dopant during crystal growth. Doping with the n-type dopant is not necessarily performed, and, for example, the band is allowed to be inclined by variation in concentration only by controlling the amounts of supplied Group III atoms and supplied Group I atoms.

Figure 17C:
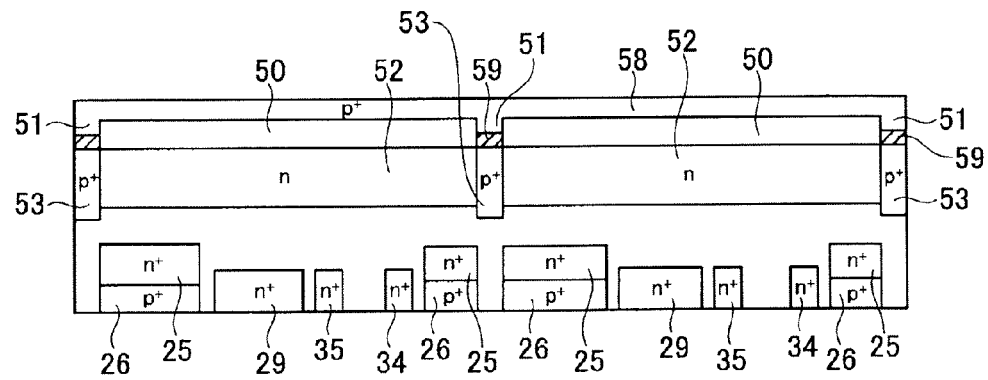
FIG. 17C is a diagram illustrating a process following FIG. 17B.

Next, as illustrated in FIG. 17C, the photoelectric conversion section-side pixel isolation section 51 and the p-type semiconductor layer 58 are formed by laterally growing a compound semiconductor with a chalcopyrite structure on the back surface side of the substrate 12. More specifically, a compound semiconductor with a chalcopyrite structure is laterally grown under a condition that a large amount of a p-type impurity such as Ga, In, As, or P is included. Accordingly, crystal growth is fast in a lateral direction; therefore, while the p-type compound semiconductor is embedded in a trench between adjacent photoelectric conversion sections 50, the highly concentrated p-type semiconductor layer 58 is formed above the photoelectric conversion sections 50.

In this case, in a sectional configuration diagram illustrated in FIG. 2, the insulating film 59 used during selection growth of the photoelectric conversion sections 50 is not illustrated.

Moreover, in the MOCVD method and the MBE method, whether lateral growth or selection growth is performed is allowed to be controlled by pressure control during crystal growth.

In this embodiment, for example, the photoelectric conversion section-side pixel isolation section 51 and the p-type semiconductor layer 58 are so formed as to have an impurity concentration of $1 \times 10^{17}$ to $1 \times 10^{19}$ cm$^3$. Thus, the photoelectric conversion section-side pixel isolation section 51 that partitions the photoelectric conversion section 50 for each pixel and the p-type semiconductor layer 58 on the light incident side of the photoelectric conversion section 50 are formed.

After that, the respective pixel transistors are formed on the front surface side of the substrate 12, and the transparent electrode 57, the color filter layer 23, and the on-chip lens 24 are formed on the back surface side of the substrate 12.

Thus, the solid-state image pickup unit of this embodiment is allowed to be manufactured.

In this manufacturing method, the photoelectric conversion section-side pixel isolation section 51 and the p-type semiconductor layer 58 are formed by lateral growth; therefore, compared to a case where they are formed by a process such as ion implantation or annealing, damage during ion implantation, an adverse effect on a wiring layer during annealing, and the like are not caused. Therefore, damage during a manufacturing process is allowed to be reduced.

It is to be noted that the method of manufacturing the solid-state image pickup unit according to this embodiment is not limited to the above-described two manufacturing methods.

For example, subsequent to the process illustrated in FIG. 14E, after the resist layer 56 is formed to form the photoelectric conversion section-side pixel isolation section 51, the p-type semiconductor layer 58 may be formed by ion-implanting the p-type impurity on the light incident surface side of the photoelectric conversion section 50. In other words, before forming the p-type semiconductor layer 58, the photoelectric conversion section-side pixel isolation section 51 may be formed.

Incidentally, in this embodiment, a case where the silicon substrate with a (100) plane as a main plane is used, and the compound semiconductor is epitaxially grown on the main plane to form the photoelectric conversion section is described. In other words, in this embodiment, a case where a {100} substrate is used is described. However, the present technology is not limited thereto.

In a case where the above-described compound semiconductor is epitaxially grown as a material of an ionic element on a nonpolar silicon substrate having no ionicity, a defect called anti-phase domain may be caused. In other words, cations and anions locally grow in opposite phase, thereby causing an anti-phase domain.

Therefore, an off substrate may be used as the silicon substrate. The occurrence of an anti-phase domain is allowed to be suppressed by epitaxial growth on the off substrate. For example, a region where the anti-phase domain occurs is self-quenched during crystal growth by using the off substrate in which a plane direction of the {100} substrate made of silicon is off in a <011> direction; therefore, crystallinity is allowed to be improved. As the off substrate, for example, a substrate with an inclination angle of 1 to 10° may be used.

Figure 18:
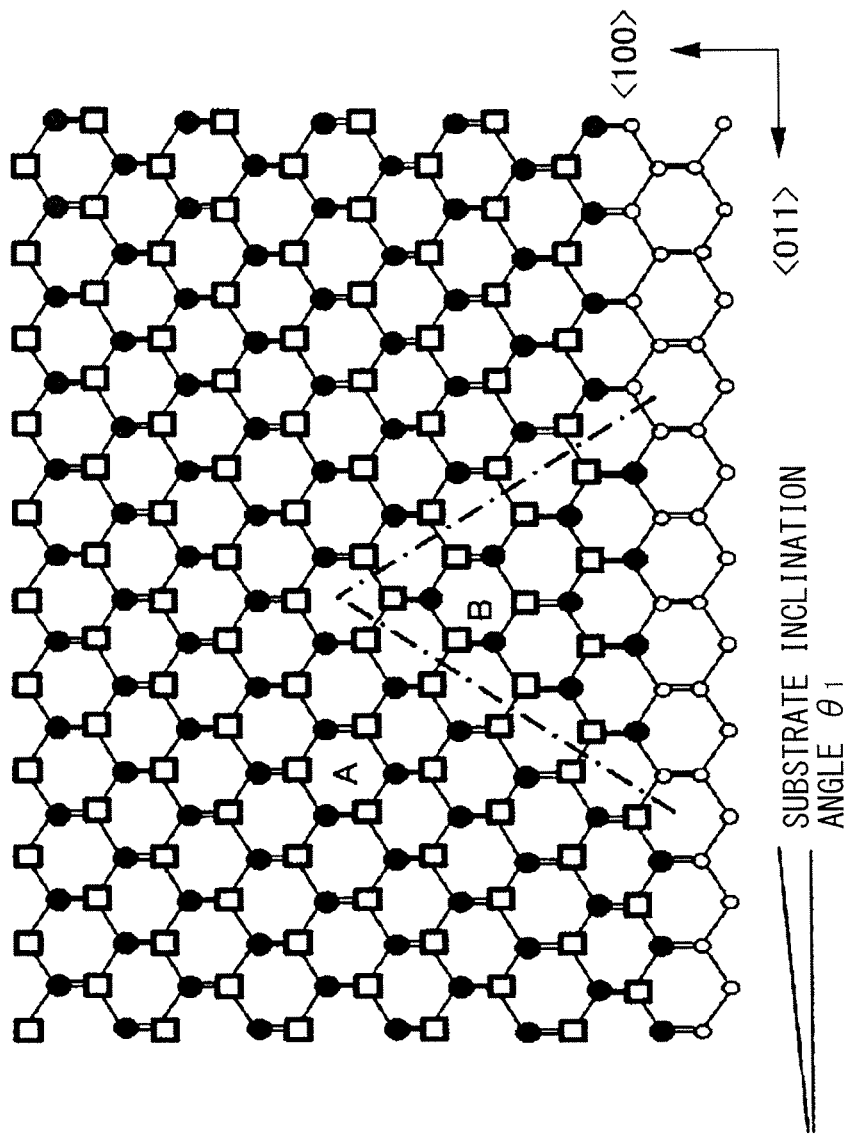
FIG. 18 is a diagram illustrating an atomic arrangement when the photoelectric conversion section is formed on an off substrate.

In this case, an atomic arrangement when the photoelectric conversion section is formed on the silicon substrate as the off substrate is illustrated in FIG. 18.

In FIG. 18, for example, the Group I atom is a copper (Cu) atom, and a Group III atom is a gallium (Ga) atom or an indium (In) atom, and a Group VI atom is a sulfur (S) atom, a selenium (Se) atom, or the like. In FIG. 18, a "Group I or Group III atom array" indicated by white square marks indicates that group I atoms and group III atoms are alternately arranged in a direction perpendicular to a paper plane.

FIG. 18 illustrates a case where growth start from a Group VI atom on the silicon substrate, and a case where an anti-phase domain between a Group I or Group III cation (a positive ionic atom) and a Group VI anion (a negative ionic atom) is eliminated on the silicon substrate.

As illustrated in FIG. 18, for example, as the silicon substrate, an off substrate obtained by allowing a {100} substrate to be off at an inclination angle (an off angle) θ1 in a <011> direction is used.

A film of the photoelectric conversion section 50 is formed by regularly arranging Group I or Group III cations (positive ionic atoms) and Group VI anions (negative ionic atoms) on the silicon substrate as the off substrate.

At this time, the cations and the anions may locally grow in opposite phase, thereby causing an anti-phase domain as illustrated in a region B (a region partitioned by an alternate long and short dashed line).

However, as illustrated in FIG. 18, a crystal is grown on a surface of the off substrate; therefore, the region B where the anti-phase domain occurs is confined in a triangular shape. Then, epitaxial growth proceeds to form only a region A in which no anti-phase domain occurs above the region B. The occurrence of the anti-phase domain is allowed to be suppressed in such a manner.

It is to be noted that, more specifically, FIG. 18 illustrates a case where the inclination angle (off angle) θ1 is 6°; however, the effect is obtained by an off substrate with an inclination angle within the above-described range of 1° to 10°.

According to the configuration of the solid-state image pickup unit 1 of this embodiment, since the photoelectric conversion section 50 is so formed as to be laminated on the substrate 12, it is not necessary to provide the photoelectric conversion section in the substrate 12; therefore, miniaturization of pixels is achievable.

Moreover, the first charge accumulation section 52 formed on the back surface side of the substrate 12 and the respective pixel transistors formed on the front surface side of the substrate 12 are so formed as to be laminated in the depth direction of the substrate 12; therefore, further miniaturization of pixels is achieved.

Since the miniaturization of pixels is allowed to be achieved, downsizing of the solid-state image pickup unit 1 and an increase in the number of pixels are allowed to be achieved. Then, a high-resolution image is allowed to be provided by achieving an increase in the number of pixels.

Further, in this embodiment, the photoelectric conversion section 50 formed in the entire pixel region 3 is configured to double as a light-shielding section; therefore, incident light does not reach the substrate 12, thereby suppressing the generation of noise.

Then, according to the configuration of the solid-state image pickup unit 1 of this embodiment, the first charge accumulation section 52 and the second charge accumulation section 25 are provided. Therefore, the signal charges accumulated in the first charge accumulation sections 52 are transferred to the second charge accumulation sections 25 simultaneously in all of the pixels, and after the signal charges are temporarily held in the second charge accumulation sections 25, the signal charges are allowed to be transferred to the floating diffusion sections 34 from one row to another to be read to the vertical signal lines.

Therefore, in the solid-state image pickup unit 1 that achieves miniaturization of pixels, a global shutter operation is possible; therefore, exposure is allowed to be performed simultaneously in all of the pixels, and focal plane distortion is eliminated.

Moreover, exposure is allowed to be performed simultaneously in all of the pixels without providing the light-shielding film; therefore, compared to a case where the light-shielding film is provided, an improvement in sensitivity and an improvement in a saturation charge amount are allowed to be achieved by expanding an opening.

Further, in this embodiment, before completing a reading period, an exposure period in a next frame is allowed to start by separately providing the second reset transistor Tr4 that resets the signal charge accumulated in the first charge accumulation section 18. Such an effect is effective specifically in moving image shooting.

Furthermore, according to the configuration of the solid-state image pickup unit 1 of this embodiment, the second charge accumulation section 25 and the floating diffusion section 34 are formed in the peripheral portion of the pixel. Accordingly, the second charge accumulation section (accumulation section) 25 and the floating diffusion section 34 are separated from the central portion serving as a light-condensing region by the on-chip lens 24 of the pixel. Therefore, smear noise generated by entry of light is reduced, thereby obtaining a high S/N ratio.

Moreover, since the discharge section 29 and the reset section 35 are formed in the central portion serving as the light-condensing region of the pixel, a charge causing smear noise is allowed to be discharged by them, thereby reducing smear noise.

Thus, the solid-state image pickup unit 1 having a global shutter function, a small dark current, and small kTC noise is allowed to be achieved.

Then, according to the configuration of the solid-state image pickup unit 1 of this embodiment, compared to an existing CMOS image sensor having a global shutter function, miniaturization of pixels is achievable, and high resolution is allowed to be achieved. Moreover, noise caused by leakage of diffracted light or scattering light generated during signal reading into the accumulation section is not added, and the solid-state image pickup unit 1 is of the backside illumination type; therefore, image pickup with high sensitivity, high saturation sensitivity, and high image quality is allowed to be provided.

According to this embodiment, the solid-state image pickup unit 1 that has high sensitivity and a high saturation charge amount and is capable of providing an image with high resolution and favorable image quality is allowed to be achieved.

2. First Modification Example of First Embodiment

In the first embodiment, as illustrated in FIG. 2, the p-type semiconductor layer 58 is formed on the photoelectric conversion section 50.

On the other hand, the p-type semiconductor layer 58 may be omitted.

Moreover, the transparent electrode 57 above the photoelectric conversion section 50 may be omitted.

Further, the photoelectric conversion section-side pixel isolation section 51 that partitions the photoelectric conversion section 50 for each pixel may be omitted.

Hereinafter, a case where the p-type semiconductor layer, the transparent electrode, and the photoelectric conversion side pixel isolation section are omitted will be described as a first modification example.

Figure 19:
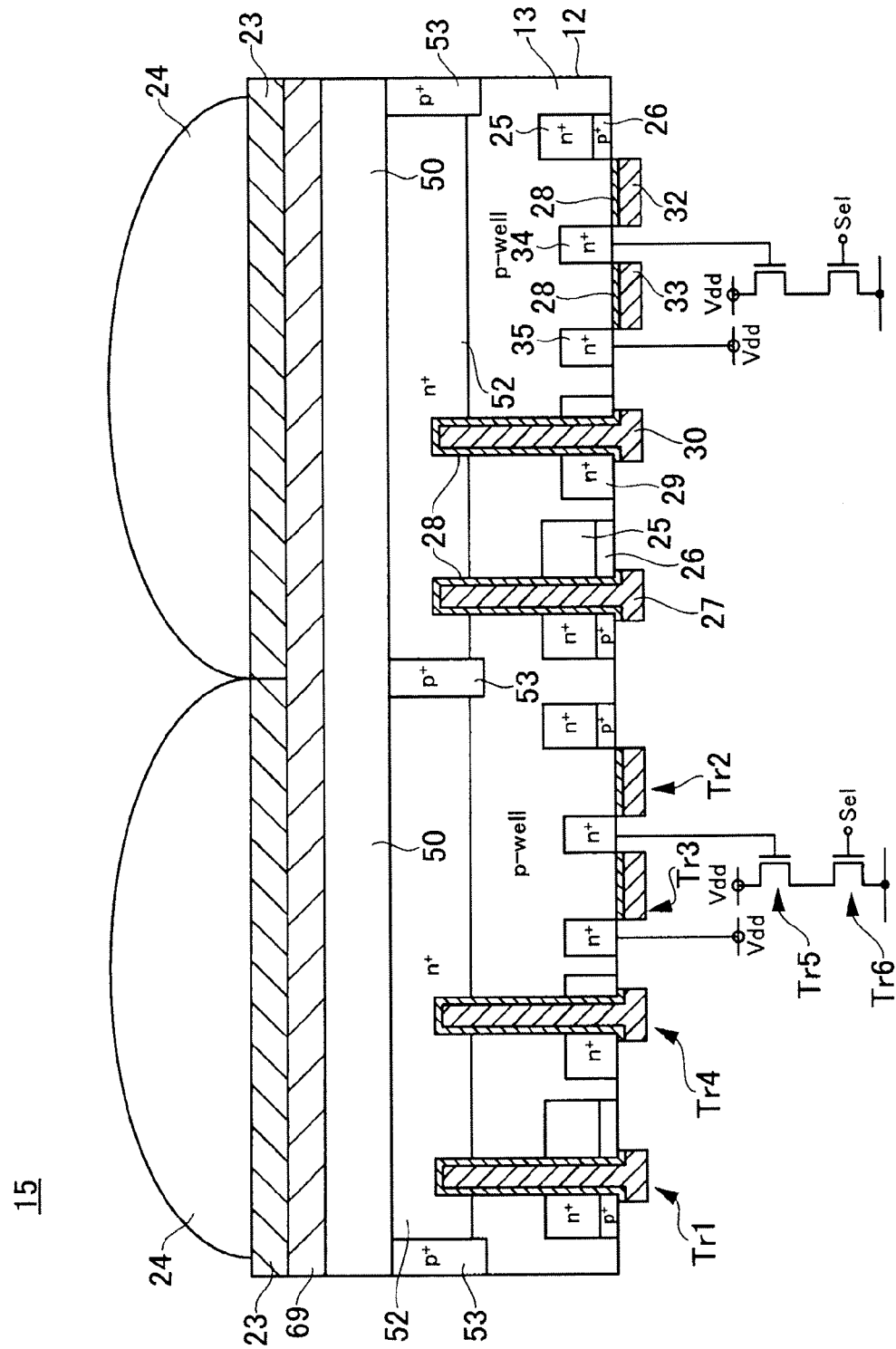
FIG. 19 is a schematic configuration diagram (a sectional view of a main part) of a solid-state image pickup unit of a first modification example of the first embodiment.

A schematic configuration diagram (a sectional view of a main part) of a solid-state image pickup unit 15 of the first modification example of the first embodiment is illustrated in FIG. 19.

In FIG. 19, components corresponding to those in FIG. 2 are denoted by same numerals, and will not be further described.

In the solid-state image pickup unit 15 of this first modification example, as illustrated in FIG. 19, an insulating layer 69 is formed on the photoelectric conversion section 50, and the color filter layer 23 is formed on the insulating layer 69.

In other words, the p-type semiconductor layer 58 illustrated in FIG. 2 above the photoelectric conversion section 50 is omitted, and the insulating layer 69 is formed instead of the transparent electrode 57 in FIG. 2.

Moreover, as illustrated in FIG. 19, the photoelectric conversion section 50 are continuously formed over adjacent pixels, and the photoelectric conversion section-side pixel isolation section 51 that partitions the photoelectric conversion section 50 for each pixel in FIG. 2 is also omitted.

In a case where the photoelectric conversion section 50 is not partitioned for each pixel in such a manner, for example, a CuInGaS photoelectric conversion film configuring the photoelectric conversion section 50 may be made of a p-type semiconductor or an intrinsic semiconductor with a low carrier concentration.

At this time, an n-type (the first accumulation section 52) and a p-type (the p-type semiconductor layer 53) are configured to be alternately formed in a lateral direction of the front surface of the substrate 12, and pixels are isolated from one another in the substrate 12. Therefore, an energy barrier is formed, and an energy barrier is also generated in the CuInGaS photoelectric conversion film thereabove.

Other configurations are similar to those in the solid-state image pickup unit 1 of the first embodiment illustrated in FIG. 2, and will not be further described.

Hereinafter, the above-described energy barrier will be described referring to sectional band structures in the vertical direction and the horizontal direction.

Figure 20A:
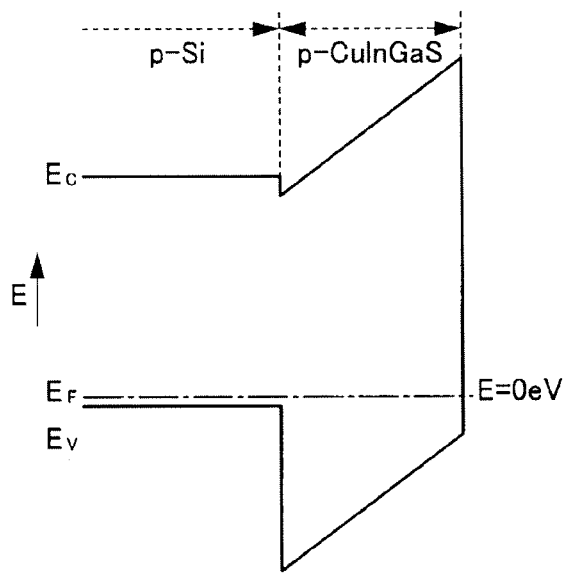
FIG. 20A is a diagram illustrating a sectional band structure in a vertical direction of the substrate and the photoelectric conversion section in FIG. 19.
Figure 20B:
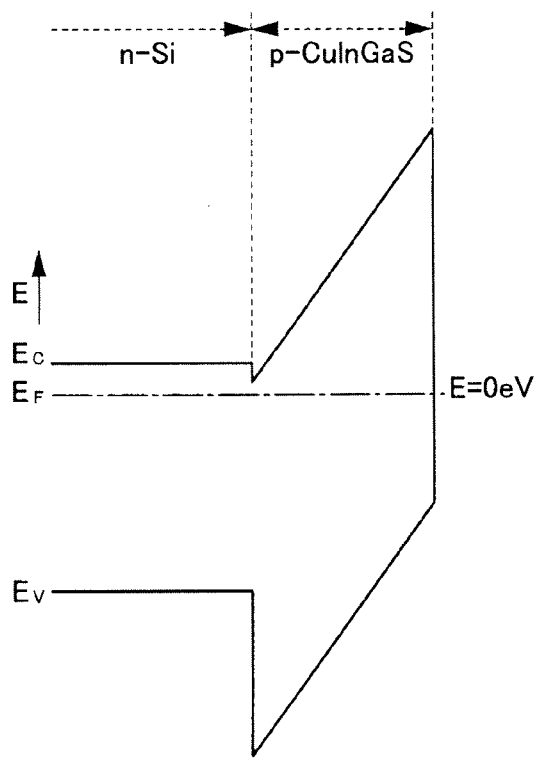
FIG. 20B is a diagram illustrating a sectional band structure in the vertical direction of the substrate and the photoelectric conversion section in FIG. 19.

FIG. 20A and FIG. 20B illustrate sectional band structures in the vertical direction of the substrate 12 and the photoelectric conversion section 50 in FIG. 19. FIG. 20A illustrates a sectional band structure of a portion (an end portion of the pixel) of the p-type semiconductor layer 53, and FIG. 20B illustrates a sectional band structure of a portion (a central portion of the pixel) of the first accumulation section 52.

Figure 21:
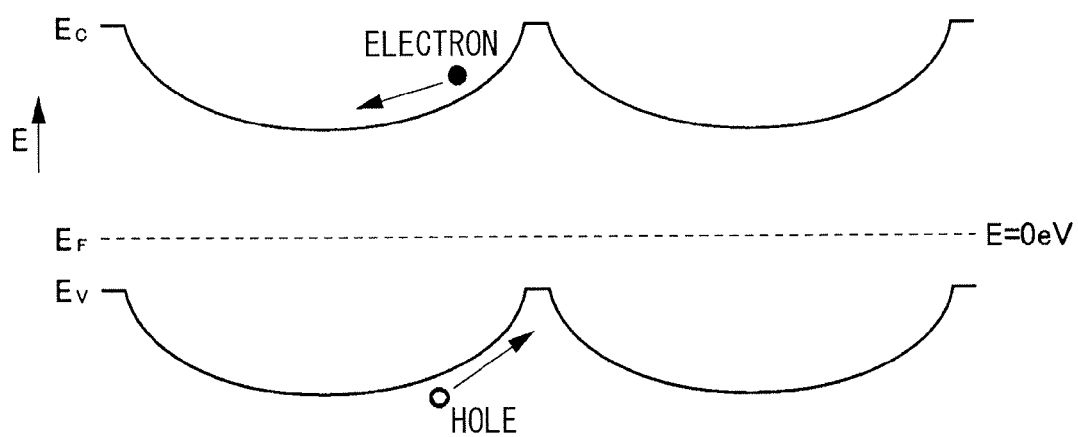
FIG. 21 is a diagram illustrating a sectional band structure in a horizontal direction of the photoelectric conversion section in FIG. 19.

Moreover, FIG. 21 illustrates a sectional band structure in the horizontal direction of the photoelectric conversion section 50 in FIG. 19.

As illustrated in FIG. 20A, in the end portion of the pixel, CuInGaS is in contact with p-type silicon, and a Fermi level $E_F$ is around a valence band upper end $E_V$ of silicon; therefore, even in CuInGaS, large band bending does not occur. Accordingly, a conduction band lower end $E_C$ is present on a higher energy side than the Fermi level $E_F$ (that is present on a side closer to a vacuum level).

On the other hand, as illustrated in FIG. 20B, in the central portion of the pixel, CuInGaS is in contact with n-type silicon, and the Fermi level $E_F$ is around the conduction band lower end $E_C$ of silicon. Therefore, large band bending occurs in CuInGaS, and the conduction band lower end $E_C$ of CuInGaS is present at a position close to the Fermi level $E_F$ (on a low energy side) (and is present at a position far from the vacuum level). In this case, the energy of the Fermi level $E_F$ is 0 eV.

Accordingly, in the CuInGaS film, a horizontal-direction sectional band structure illustrated in FIG. 21 is provided. In this case, the end portion of the pixel serves as an energy barrier against electrons generated by photoelectric conversion; therefore, electrons are collected into the central portion of the pixel.

Moreover, as illustrated in FIG. 20A and FIG. 20B, electrons are transported to an n-type silicon side by inclination of an internal electric field toward the substrate 12 side or by application of a reverse bias to a pn junction between p-type silicon and n-type silicon of the substrate 12.

On the other hand, the central portion of the pixel serves as an energy barrier against holes generated by photoelectric conversion; therefore, holes are collected into the end portion of the pixel.

Moreover, holes are transported to a p-type silicon side by application of a reverse bias to a pn junction between p-type silicon and n-type silicon of the silicon substrate.

Therefore, pixel isolation in CuInGaS and the transparent electrode thereabove are not absolutely necessary.

According to the configuration of the solid-state image pickup unit 15 of this first modification example, the pixel isolation section of the photoelectric conversion section 50 and the transparent electrode are not necessary. Therefore, a reduction in material cost for the transparent electrode is allowed to be achieved, and reductions in the number of processes and manufacturing cost are allowed to be achieved by simplification of the manufacturing process.

It is to be noted that, in the first modification example, both the p-type semiconductor layer 58 and the transparent electrode 57 in FIG. 2 are omitted; however, either the p-type semiconductor layer 58 or the transparent electrode 57 may be omitted.

Second Modification Example of First Embodiment

In a case where the photoelectric conversion section 50 is formed on the substrate 12 as with the first embodiment, an intermediate layer that reduces a potential barrier may be provided to easily move a signal charge generated by the photoelectric conversion section 50 from the photoelectric conversion section 50 side to the substrate 12 side. Hereinafter, a case where the intermediate layer is provided will be described below as a second modification example.

Figure 22:
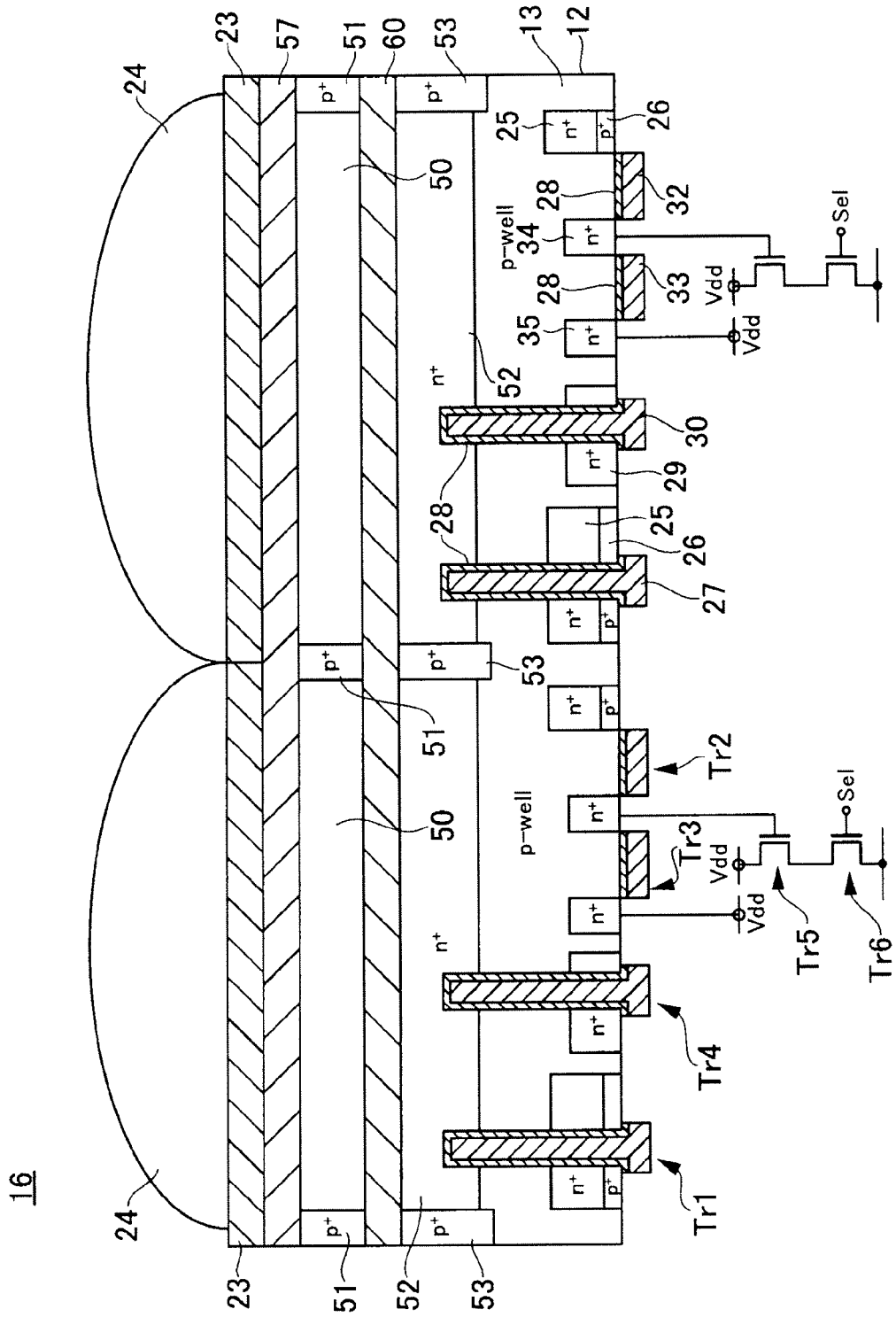
FIG. 22 is a schematic configuration diagram (a sectional view of a main part) of a solid-state image pickup unit of a second modification example of the first embodiment.

A schematic configuration diagram (a sectional view of a main part) of a solid-state image pickup unit 16 of the second modification example of the first embodiment is illustrated in FIG. 22.

In FIG. 22, components corresponding to those in FIG. 2 are denoted by same numerals, and will not be further described.

In the solid-state image pickup unit 16 of the second modification example, as illustrated in FIG. 22, an intermediate layer 60 is formed between the substrate 12 and the photoelectric conversion section 50. This intermediate layer 60 is allowed to be formed of a material having electron affinity between electron affinity of the substrate 12 and electron affinity of the photoelectric conversion section 50. For example, the intermediate layer 60 may be most preferably so formed as to have electron affinity just at the midpoint between the electron affinity of the silicon substrate 12 and the electron affinity of the photoelectric conversion section 50.

More specifically, the intermediate layer 60 is allowed to be made of $CuGa_{0.64}In_{0.36}S_2$, and a film thickness thereof is allowed to be 5 nm. It is only necessary for the intermediate layer 60 to have a thickness equal to or smaller than a critical film thickness. For example, in a case where the intermediate layer 60 is made of $CuGa_{0.64}In_{0.36}S_2$, lattice mismatch to the substrate 12 is $\Delta a/a = 5.12 \times 10^{-3}$. At this time, when the film thickness is 5 nm, the film thickness is smaller than the critical film thickness defined by the above-described "Matthew-Blakeslee model" or the above-described "People-Bean model".

In addition, in a case where the photoelectric conversion section 50 is made of a p-type semiconductor, the intermediate layer 60 is allowed to be made of an n-type semiconductor. In particular, in a case where the photoelectric conversion section 50 is configured of a p-type chalcopyrite layer, the intermediate layer 60 may be preferably made of a Group II-VI semiconductor (refer to references 1 to 3).
Reference 1: Takeshi Yagioka and Tokio Nakada, Apllied Physics Express 2 (2009)072201
Reference 2: S. P. Grindle, A. H. Clark, S. Rezaie-Serej, E. Falconer, and J. McNeily, and L. L. Kazmerski, J. Appl. Phys. 51(10).(1980)5464
Reference 3: T. Makada, N. Okano, Y. Tanaka, H. Fukuda, and A. Kunioka, First WCOEC; Dec. 5-9, 1994; Hawaii In this case, a ZnS layer, CdS layer, or a ZnO layer may be sandwiched as the intermediate layer 60 at an interface between the p-type chalcopyrite layer configuring the photoelectric conversion section 50 and the substrate 12 made of silicon. Moreover, in a case where the photoelectric conversion section 50 is configured of an n-type semiconductor layer, the intermediate layer 60 is allowed to be configured of a p-type semiconductor layer.

Moreover, in the solid-state image pickup unit 16 of this second modification example, the p-type semiconductor layer 58 illustrated in FIG. 2 above the photoelectric conversion section 50 is omitted.

Other configurations are similar to those in the solid-state image pickup unit 1 of the first embodiment illustrated in FIG. 2, and will not be further described.

According to the configuration of the solid-state image pickup unit 16 of the second modification example, the intermediate layer 60 is formed between the substrate 12 and the photoelectric conversion section 50 to reduce the potential barrier, thereby allowing the signal charge to be easily moved from the photoelectric conversion section 50 side to the substrate 12 side.

4. Third Modification Example of First Embodiment

Figure 23:
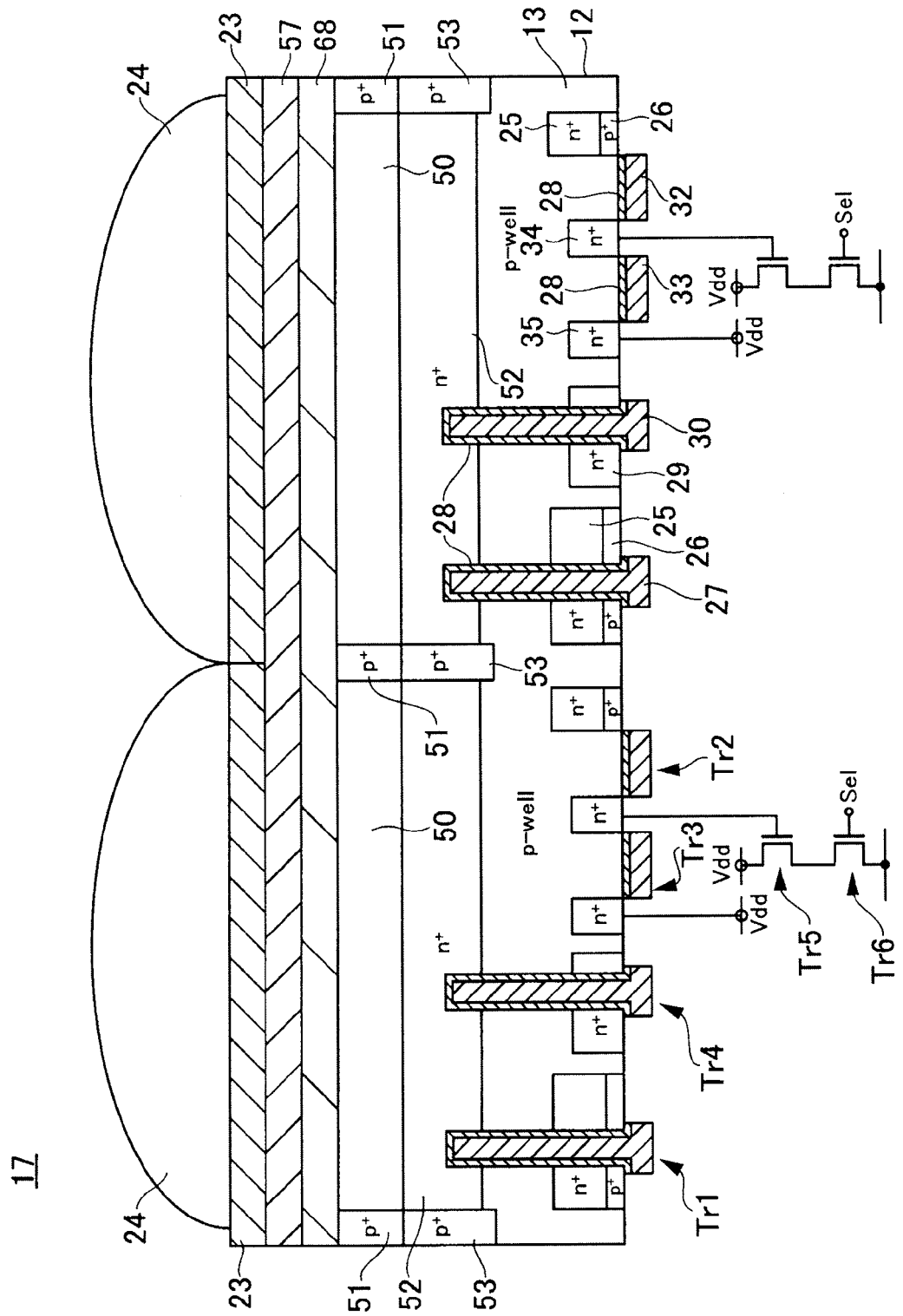
FIG. 23 is a schematic configuration diagram (a sectional view of a main part) of a solid-state image pickup unit of a third modification example of the first embodiment.

A schematic sectional view of a main part of a solid-state image pickup unit 17 according to a third modification example of the first embodiment is illustrated in FIG. 23.

In FIG. 23, components corresponding to those in FIG. 2 are denoted by same numerals, and will not be further described.

In the solid-state image pickup unit 17 of the third modification example, as illustrated in FIG. 23, a barrier layer 68 is formed between the photoelectric conversion section 50 and the transparent electrode 57. In other words, the solid-state image pickup unit 17 has a configuration in which instead of forming the p-type semiconductor layer 58, the barrier layer 68 is formed between the photoelectric conversion section 50 and the transparent electrode 57.

The barrier layer 68 is provided between the transparent electrode 57 and a top of the photoelectric conversion section 50 to prevent injection of a carrier from the transparent electrode 57 to the photoelectric conversion section 50 side. The barrier layer 68 is allowed to be formed of a material capable of preventing injection of an electron, and is allowed to be formed of, for example, a zinc oxide (ZnO) film, a nickel oxide (NiO) film, a copper oxide ($Cu_2O$) film, a diamond (C) film, or the like.

Moreover, in the solid-state image pickup unit 17 of this third modification example, the p-type semiconductor layer 58 illustrated in FIG. 2 above the photoelectric conversion section 50 is omitted.

Other configurations are similar to those in the solid-state image pickup unit 1 of the first embodiment illustrated in FIG. 2, and will not be further described.

According to the configuration of the solid-state image pickup unit 17 of the second modification example, injection of an electron from the transparent electrode 57 to the photoelectric conversion section 50 side is allowed to be prevented by forming the barrier layer 68 between the photoelectric conversion section 50 and the transparent electrode 57.

5. Fourth Modification Example of First Embodiment

In the first embodiment, the photoelectric conversion section-side pixel isolation section 51 is configured of the p-type semiconductor layer.

On the other hand, the photoelectric conversion section-side pixel isolation section 51 is allowed to be formed of a semiconductor not including a p-type impurity.

Although not illustrated, a case where the photoelectric conversion section-side pixel isolation section 51 is formed of a semiconductor not including a p-type impurity will be described as a fourth modification example of the first embodiment.

In this fourth modification example, the photoelectric conversion section-side pixel isolation section 51 is formed of a semiconductor not including a p-type impurity.

In this case, the photoelectric conversion section-side pixel isolation section 51 is allowed to be formed of a chalcopyrite-based compound semiconductor with a wide band gap. When the photoelectric conversion section-side pixel isolation section 51 is so formed as to have a band gap difference of kT=27 meV or more between the photoelectric conversion section 50 and the photoelectric conversion section-side pixel isolation section 51, a potential barrier is formed between pixels; therefore, pixels are allowed to be electrically isolated from one another.

In a case where pixels are isolated from one another with use of the band gap difference, a chalcopyrite-based compound semiconductor is laterally grown under a condition that the p-type impurity is not included in a process illustrated in FIG. 17C to form the photoelectric conversion section-side pixel isolation section 51. More specifically, for example, the photoelectric conversion section-side pixel isolation section 51 is so formed as to allow a composition ratio of copper-aluminum-gallium-indium-sulfur-selenium to be 1.0:0.36:0.64:0:1.28:0.72 or 1.0:0.24:0.23:0.53:2.0:0. When the composition is controlled in such a manner, a potential barrier is allowed to be formed between pixels, and the photoelectric conversion section-side pixel isolation section 51 is allowed to be formed.

After that, a crystal of a chalcopyrite-based compound semiconductor is grown under a large amount of an impurity such as Ga, In, As, or P is included to form the p-type semiconductor layer 58.

As described above, even in a configuration in which the photoelectric conversion section-side pixel isolation section 51 does not include the p-type impurity, pixels are allowed to be isolated from one another.

6. Second Embodiment (Solid-State Image Pickup Unit)

Figure 24:
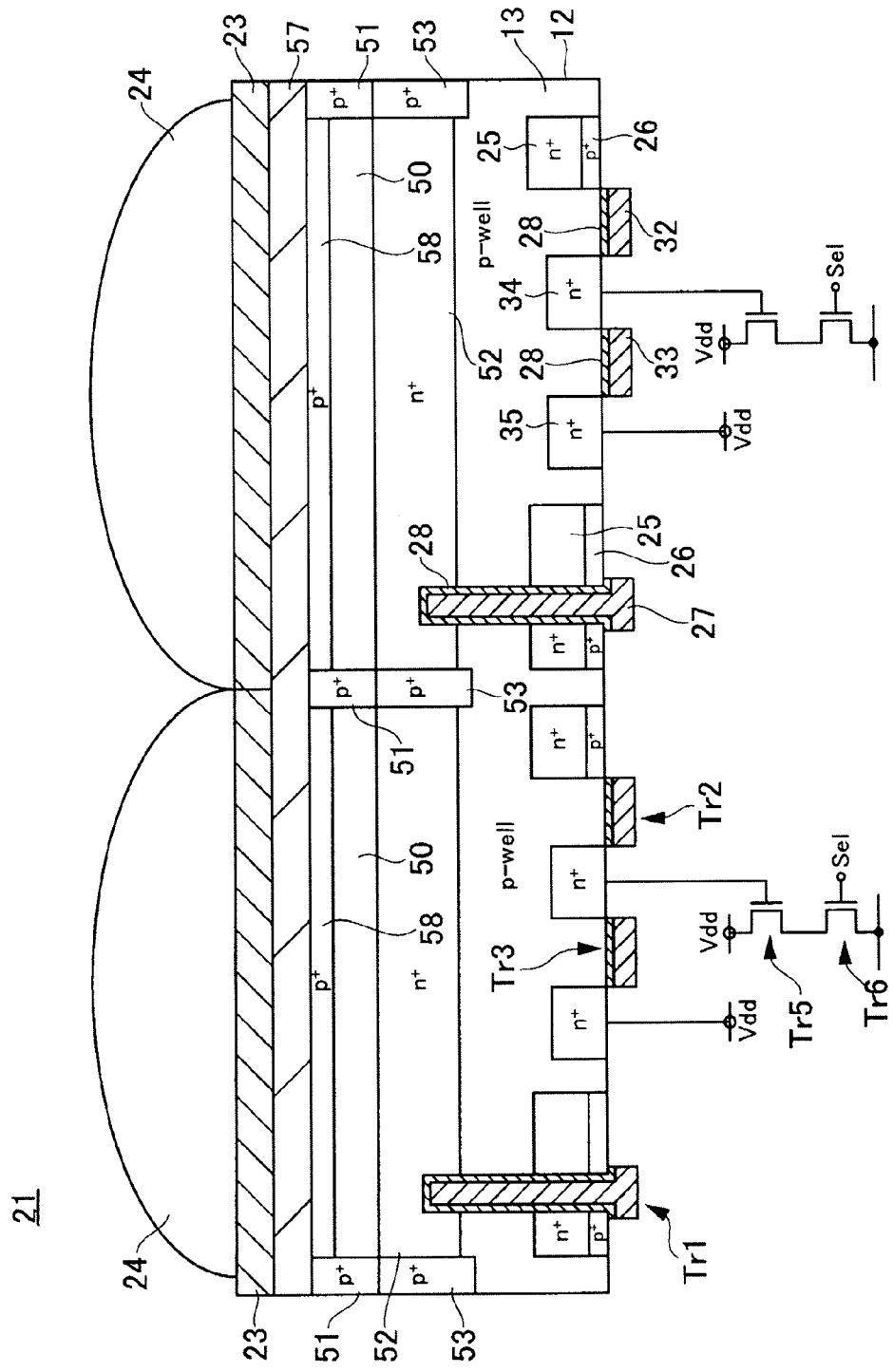
FIG. 24 is a schematic configuration diagram (a sectional view of a main part) of a solid-state image pickup unit of a second embodiment.

A schematic configuration diagram (a sectional view of a main part) of a solid-state image pickup unit 21 of a second embodiment is illustrated in FIG. 24.

The solid-state image pickup unit 21 of this embodiment is also a solid-state image pickup unit with a backside illumination type configuration in which a front surface of a semiconductor substrate serves as a circuit formation surface and a back surface of the semiconductor substrate serves as a light incident surface.

The solid-state image pickup unit 21 of this embodiment has a configuration in which the second reset transistor Tr4 of the solid-state image pickup unit 1 of the first embodiment is not formed.

In the solid-state image pickup unit 21 of this embodiment, as illustrated in FIG. 24, each pixel is configured of the first transfer transistor Tr1, the second transfer transistor Tr2, the reset transistor Tr3, the amplification transistor Try, and the selection transistor Tr6.

Moreover, in the solid-state image pickup unit 21 of this embodiment, since the second reset transistor Tr4 of the solid-state image pickup unit 1 of the first embodiment is not formed, the drain (discharge section) 29 configuring the second reset transistor Tr4 illustrated in FIG. 2 is also not formed.

Other configurations are similar to those in the solid-state image pickup unit 1 of the first embodiment; therefore, similar components are denoted by same numerals, and will not be further described.

In this embodiment, a planar configuration of the solid-state image pickup unit 21 is allowed to be similar to the planar configuration illustrated in FIG. 1.

Figure 25:
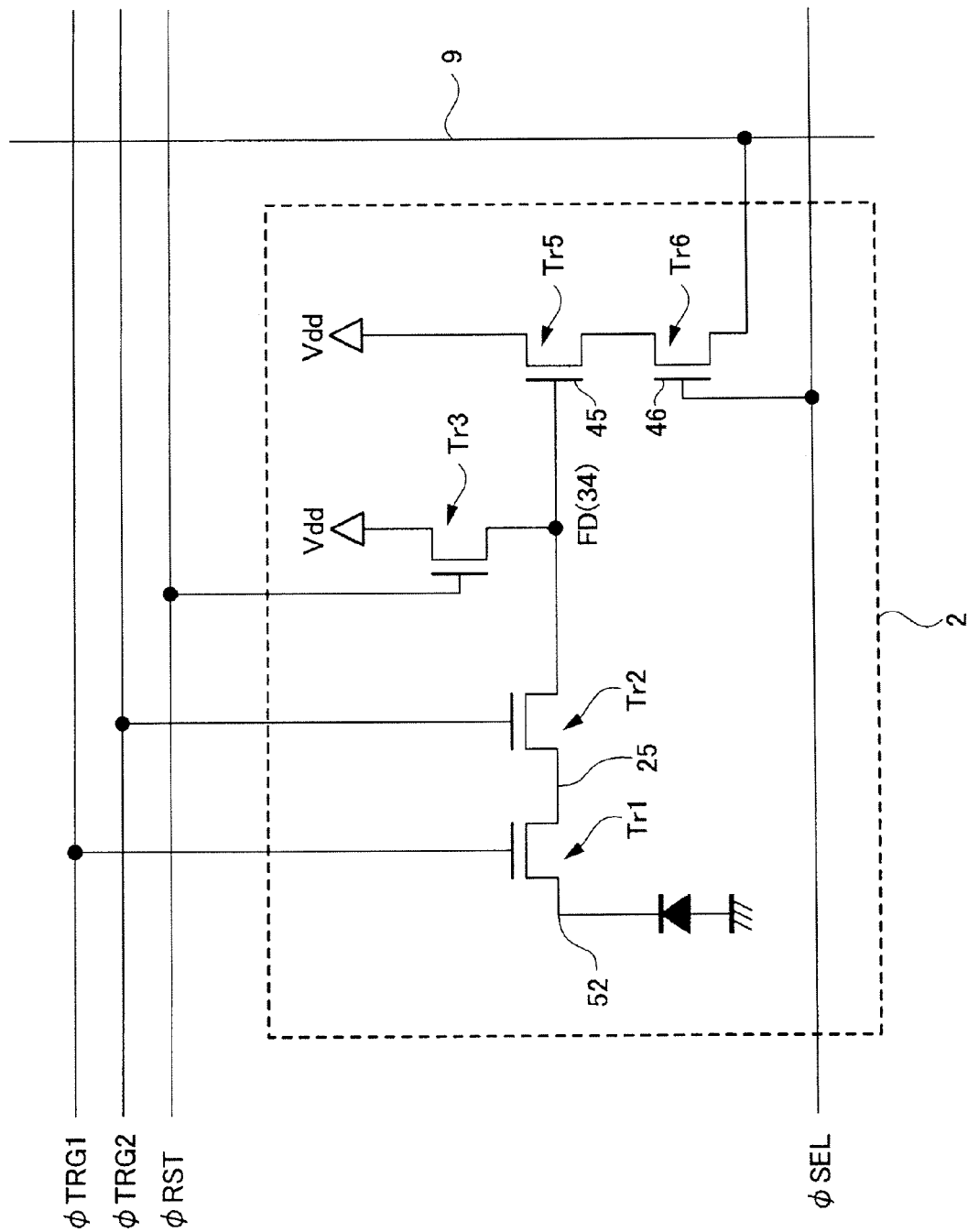
FIG. 25 is an equivalent circuit diagram of a pixel of the solid-state image pickup unit of the second embodiment.

An equivalent circuit diagram of the pixel of the solid-state image pickup unit 21 of this embodiment is illustrated in FIG. 25.

As illustrated in FIG. 25, in this embodiment, in the reset transistor Tr3, a source thereof serves as the floating diffusion section 34, and a drain 35 thereof is connected to the power supply voltage Vdd. Moreover, the reset pulse φRST is applied to the gate electrode 33 of the reset transistor Tr3 through a wiring line.

(Driving Method)

Next, a method of driving the solid-state image pickup unit 21 of this embodiment will be described below.

Figure 26:
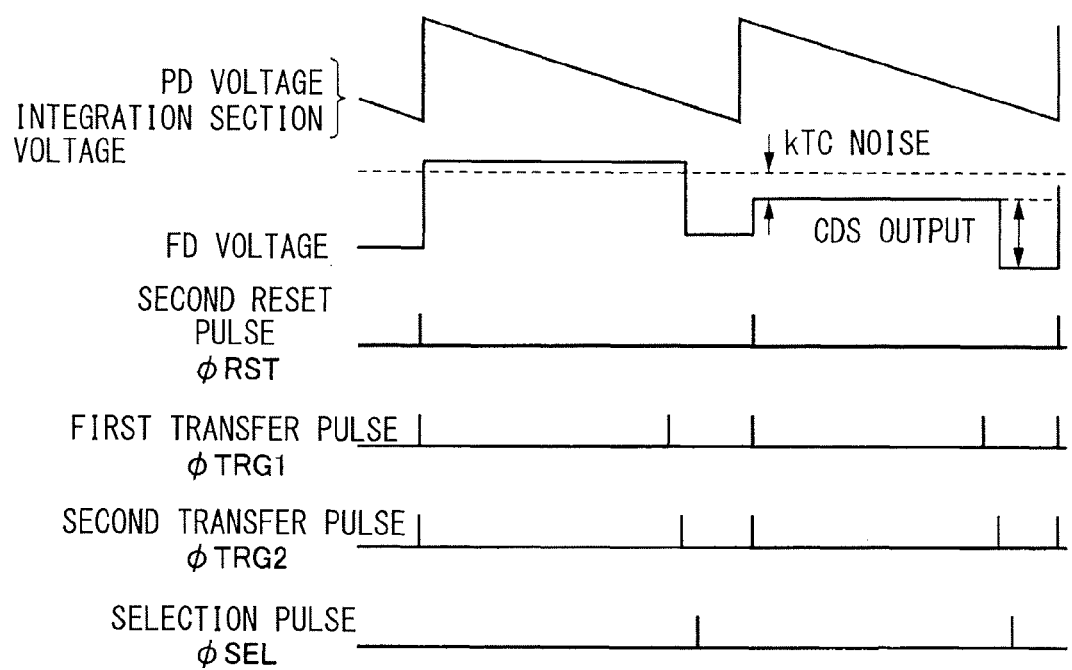
FIG. 26 is a timing chart of a method of driving the solid-state image pickup unit of the second embodiment.

A timing chart of the method of driving the solid-state image pickup unit 21 of this embodiment is illustrated in FIG. 26. Here, a timing of reading pixels belonging to the nth row will be described as an example.

Figure 27:
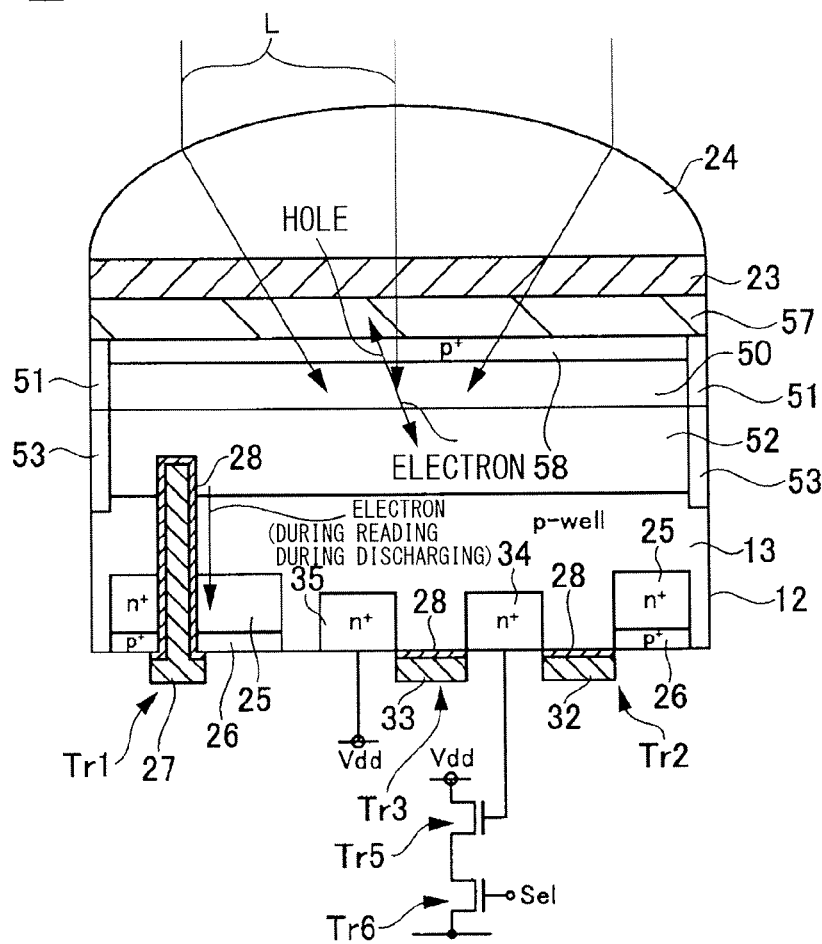
FIG. 27 is a diagram illustrating an operation of the solid-state image pickup unit of the second embodiment.

Moreover, an operation of the solid-state image pickup unit 21 of this embodiment is illustrated in a sectional view in FIG. 27.

First, supply of a reset pulse φRST and supply of a first transfer pulse φTRG1 and a second transfer pulse φTRG2 start simultaneously in all of the pixels to simultaneously turn on the reset transistor Tr3, the first transfer transistor Tr1, and the second transfer transistor Tr2. Accordingly, signal charges accumulated in the floating diffusion sections 34 are discharged to the power supply voltage Vdd side to reset the floating diffusion sections 34. At the same time, the second charge accumulation sections 25 and the first charge accumulation sections 52 are also electrically connected to the power supply voltage Vdd; therefore, the second charge accumulation sections 25 and the first charge accumulation sections 52 are also reset.

In this case, the signal charge accumulated in the floating diffusion section 34 before reset is a signal charge read from a previous frame. Moreover, the signal charge accumulated in the first charge accumulation section 52 is a signal charge generated by the photoelectric conversion section 50 after the exposure period is completed in the previous frame.

After that, the supply of the reset pulse φRST, the first transfer pulse φTRG1, and the second transfer pulse φTRG2 stops simultaneously in all of the pixels to turn off the reset transistor Tr3, the first transfer transistor Tr1, and the second transfer transistor Tr2. Then, the exposure period starts by turning off the first transfer transistor Tr1.

Next, supply of the first transfer pulse φTRG1 starts simultaneously in all of the pixels to turn on the first transfer transistor Tr1. Accordingly, the exposure period is terminated, and the signal charges accumulated in the first charge accumulation sections 52 are transferred to the second charge accumulation sections 25.

After that, the supply of the first transfer pulse φTRG1 stops simultaneously in all of the pixels to turn off the first transfer transistor Tr1.

In this embodiment, the signal charges read by the second charge accumulation sections 25 simultaneously in all of the pixels are in a state in which the signal charges are held by the second charge accumulation sections 25 until reading on each row.

These operations are performed simultaneously in all of the pixels.

In this embodiment, global exposure starts by turning off the reset transistors Tr3, the first transfer transistors Tr1, and the second transfer transistors Tr2 simultaneously in all of the pixels. Then, the global exposure is terminated by turning on the first transfer transistors Tr1 simultaneously in all of the pixels. In other words, a period from when the first transfer transistors Tr1 are turned off to when the first transistors Tr1 are turned on is considered as an exposure period. In the exposure period, a signal charge according to an amount of light incident on the photoelectric conversion section 0 is generated by the photoelectric conversion section 50. Then, the signal charge generated by the photoelectric conversion section 50 moves along a potential in the substrate 12 to be accumulated in the first charge accumulation section 52.

Next, reading starts from one row to another. In reading of the signal charge in the nth row, when the turn of operation in the nth row comes, the supply of the second transfer pulse φTRG2 starts to turn on the second transfer transistors Tr2. Accordingly, in the pixels belonging to the nth row, the signal charges accumulated in the second charge accumulation sections 25 are transferred to the floating diffusion sections 34.

After that, the supply of the second transfer pulse φTRG2 stops to turn off the second transfer transistors Tr2.

Next, supply of the selection pulse φSEL starts to turn on the selection transistors Tr6. Accordingly, an output corresponding to a potential of the floating diffusion section 34 is captured as a pixel signal by the column signal processing circuit 5 (refer to FIG. 1). In the column signal processing circuit 5, correlated double sampling is performed by obtaining a difference between a rest signal that has been captured previously and this pixel signal. Accordingly, in the column signal processing circuit 5, a pixel signal from which kTc noise is removed is obtained.

After that, the supply of the selection pulse φSEL stops to turn off the selection transistors Tr6, and reading of pixels belonging to the nth row is completed.

After the reading of the pixels belonging to the nth row is completed, reading of pixels belonging to an n+1th row is performed, and reading of pixels in all rows is sequentially performed.

Thus, the solid-state image pickup unit 21 of this embodiment is allowed to be driven.

In the solid-state image pickup unit 21 of this embodiment, as illustrated in FIG. 27, photoelectric conversion is performed on incident light L in the photoelectric conversion section 50, and a signal charge (electrons) generated in the photoelectric conversion section 50 moves to the first charge accumulation section 52 to be accumulated mainly in the first charge accumulation section 52. Moreover, holes generated in the photoelectric conversion section 50 move to the transparent electrode 57.

Then, in the exposure period, when the first transfer transistors Tr1 are turned on, the signal charges accumulated in the first charge accumulation sections 52 are transferred to the second charge accumulation sections 25 simultaneously in all of the pixels as indicated by an arrow in "electrons (during reading and during discharging)" in FIG. 27. The signal charges transferred to the second charge accumulation sections 25 are accumulated in the second charge accumulation sections 25.

The signal charges accumulated in the second charge accumulation sections 25 are transferred to the floating diffusion sections 34 at a timing in each row.

Then, during reading, pixel signals corresponding to the amounts of the signal charges of the floating diffusion sections 34 are output to the vertical signal lines 9 through the selection transistors Tr6.

Moreover, during electron discharging, when the first transfer transistors Tr1 are turned on, the signal charges of the first charge accumulation sections 52 are discharged to the second charge accumulation sections 25 simultaneously in all of the pixels as indicated by an arrow in "electrons (during reading and during discharging)" of FIG. 12. At this time, the second transfer transistors Tr2 and the first reset transistors Tr3 are also turned on; therefore, the signal charges discharged to the second charge accumulation sections 25 are further discharged through the floating diffusion sections 34 and the drains (reset sections) 35.

(Manufacturing Method)

Since the solid-state image pickup unit 21 of this embodiment is different from the solid-state image pickup unit 1 of the first embodiment only in that respective components of the second reset transistor Tr4 are not included, the solid-state image pickup unit 21 is allowed to be manufactured by adopting the above-described manufacturing method of the first embodiment.

As a specific example of the manufacturing method described in the first embodiment, a manufacturing method in a case where the photoelectric conversion section 50 is formed of the chalcopyrite material is described.

Hereinafter, as another specific example of the manufacturing method, a manufacturing method in a case where the photoelectric conversion section 50 is formed of a silicide material will be described.

First, as the substrate 12, a silicon substrate is prepared.

Next, the photoelectric conversion section 50 made of a silicide material is formed on the substrate 12.

As a method of forming the silicide material, the following two methods are adopted.

(1) A method in which a metal material (iron, nickel, cobalt, barium, or the like) for a silicide is evaporated on the silicon substrate in advance, and after that, the silicide is formed by annealing treatment.

(2) A method in which a crystal of a silicide material is grown by an MBE method, an MOCVD method, or the like.

With use of one of these two methods, for example, cobalt silicide is formed with a thickness of 300 nm on the silicon substrate to form the photoelectric conversion section 50. An absorption coefficient of this material base is one or more orders of magnitude higher than the absorption coefficient of silicon; therefore, the material base is allowed to serve as both the light-shielding section and the photoelectric conversion section.

It is to be noted that, in addition to the silicide, for example, FeS2 also has a high absorption coefficient; therefore, similar effects are obtained by FeS2.

According to the above-described configuration of the solid-state image pickup unit 21 of this embodiment, since the photoelectric conversion section 50 is so formed as to be laminated on the substrate 12, it is not necessary to provide the photoelectric conversion section in the substrate 12; therefore, miniaturization of pixels is achievable.

Moreover, the first charge accumulation section 52 formed on the back surface side of the substrate 12 and the respective pixel transistors formed on the front surface side of the substrate 12 are so formed as to be laminated in the depth direction of the substrate 12; therefore, further miniaturization of the pixels is achieved.

Since miniaturization of pixels is allowed to be achieved, downsizing of the solid-state image pickup unit 21 and an increase in the number of pixels are allowed to be achieved. Then, a high-resolution image is allowed to be provided by achieving an increase in the number of pixels.

Further, in this embodiment, the photoelectric conversion section 50 formed in the entire pixel region is configured to double as a light-shielding section; therefore, incident light does not reach the substrate 12, thereby suppressing generation of noise.

Then, according to the configuration of the solid-state image pickup unit 21 of this embodiment, the first charge accumulation section 52 and the second charge accumulation section 25 are provided. Therefore, the signal charges accumulated in the first charge accumulation sections 52 are transferred to the second charge accumulation sections 25 simultaneously in all of the pixels, and after the signal charges are temporarily held in the second charge accumulation sections 25, the signal charges are allowed to be transferred to the floating diffusion sections 34 from one row to another to be read to the vertical signal lines.

Therefore, in the solid-state image pickup unit 21 that achieves miniaturization of pixels, a global shutter operation is possible; therefore, exposure is allowed to be performed simultaneously in all of the pixels, and focal plane distortion is eliminated.

Moreover, exposure is allowed to be performed simultaneously in all of the pixels without providing the light-shielding film; therefore, compared to a case where the light-shielding film is provided, an improvement in sensitivity and an improvement in a saturation charge amount are allowed to be achieved by expanding an opening.

Further, according to the above-described configuration of the solid-state image pickup unit 21 of this embodiment, the floating diffusion section 34, the second charge accumulation section 25, and the first charge accumulation section 52 are allowed to be reset at once; therefore, there is an effect of simplifying a circuit configuration to reduce variations and reduce noise.

In addition, in the solid-state image pickup unit 21 of this embodiment, a reset transistor for resetting the first charge accumulation section 52 is not separately provided; therefore, a reduction in a pixel area is achievable.

Moreover, according to the configuration of the solid-state image pickup unit 21 of this embodiment, the second charge accumulation section 25 and the floating diffusion section 34 are formed in the peripheral portion of the pixel. Accordingly, the second charge accumulation section (accumulation section) 25 and the floating diffusion section 34 are separated from the central portion serving as the light-condensing region by the on-chip lens 24 of the pixel.

Therefore, smear noise generated by entry of light is reduced, thereby obtaining a high S/N ratio.

Further, since the reset section 35 is formed in the central portion serving as the light-condensing region of the pixel, a charge causing smear noise is allowed to be discharged by the reset section 35, thereby reducing smear noise.

Thus, the solid-state image pickup unit 21 having a global shutter function, a small dark current, and small kTC noise is allowed to be achieved.

Then, according to the configuration of the solid-state image pickup unit 21 of this embodiment, compared to an existing CMOS image sensor having a global shutter function, miniaturization of pixels is achievable, and high resolution is allowed to be achieved. Moreover, noise caused by leakage of diffracted light or scattering light generated during signal reading into the accumulation section is not added, and the solid-state image pickup unit 21 is of the backside illumination type; therefore, image pickup with high sensitivity, high saturation sensitivity, and high image quality is allowed to be provided.

According to this embodiment, the solid-state image pickup unit 21 that has high sensitivity and a high saturation charge amount and is capable of providing an image with high resolution and favorable image quality is allowed to be achieved.

It is to be noted that the above-described configuration of the second embodiment is allowed to be modified in a similar manner to any of the first to fourth modification examples of the above-described first embodiment.

Moreover, two or more of the configurations of the first to fourth modification examples may be combined as long as such a combination is possible.

Further, in the solid-state image pickup unit of the present technology, an antireflective film may be provided above the photoelectric conversion section.

As the antireflective film, for example, it is effective to form a film of SiN or HfO with a thickness of up to $\lambda/(4n)$. Here, n is a refractive index of the antireflective film and $\lambda$ is a wavelength of light.

All of the above-described respective embodiments and the above-described respective modification examples have a configuration in which electrons serve as carriers and a photocharge of negative polarity is read.

The present technology is applicable to a configuration in which holes serve as carriers and a photocharge of positive polarity is read, and in this case, a configuration in which all of the n-type components and the p-type components are reversed in polarity may be adopted, and a reverse conducting type may be used for doping.

The present technology is applicable to not only the solid-state image pickup unit but also an image pickup unit. The image pickup unit encompasses a camera system such as a digital still camera and a digital video camera and an electronic apparatus having an image pickup function such as a cellular phone.

7. Third Embodiment (Electronic Apparatus)

Next, an electronic apparatus of a third embodiment will be described below.

Figure 28:
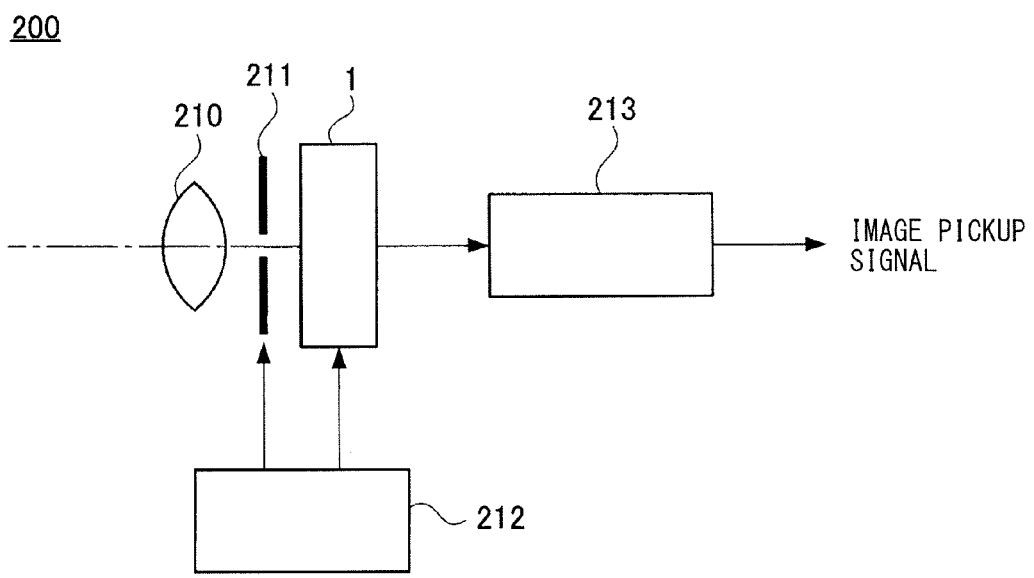
FIG. 28 is a schematic configuration diagram (a block diagram) of an electronic apparatus of a third embodiment.

A schematic configuration diagram (a block diagram) of an electronic apparatus of a third embodiment is illustrated in FIG. 28.

As illustrated in FIG. 28, an electronic apparatus 200 of this embodiment includes the solid-state image pickup unit 1 of the first embodiment, an optical lens 210, a shutter unit 211, a drive circuit 212, and a signal processing circuit 213.

The optical lens 210 forms an image of image light (incident light) from a subject on an image pickup plane of the solid-state image pickup unit 1. Therefore, a signal charge is accumulated in the solid-state image pickup unit 1 for a certain period.

The shutter unit 211 controls a light application period and a light-shielding period for the solid-state image pickup unit 1.

The drive circuit 212 supplies a drive signal that controls a signal charge transfer operation and a shutter operation of the shutter unit 211 in the solid-state image pickup unit 1. Signal transfer of the solid-state image pickup unit 1 is performed by a drive signal (a timing signal) supplied from the drive circuit 212.

The signal processing circuit 213 performs various kinds of signal processing. An image signal subjected to signal processing is stored in a storage medium such as a memory, or is output to a monitor.

In the electronic apparatus 200 of this embodiment, miniaturization of pixels is achieved in the solid-state image pickup unit 1; therefore, downsizing and higher resolution of the electronic apparatus 200 are achieved. Moreover, exposure is allowed to be performed simultaneously in all of the pixels in the solid-state image pickup unit 1, and a high S/N ratio is obtained; therefore, an improvement in image quality is achieved.

The electronic apparatus 200 to which the solid-state image pickup unit 1 is applicable is not limited to a digital video camera, and the solid-state image pickup unit 1 is applicable to a digital still camera, and an image pickup apparatus such as a camera module for a mobile device such as a cellular phone.

In the above-described electronic apparatus of this embodiment, the solid-state image pickup unit 1 of the first embodiment is used as the solid-state image pickup unit.

The electronic apparatus of the present technology is not limited to a configuration using the solid-state image pickup unit 1 of the first embodiment, and any solid-state image pickup unit of the present technology is allowed to be used.

Moreover, the configuration of the electronic apparatus of the present technology is not limited to the configuration illustrated in FIG. 28, and as long as the electronic apparatus has a configuration using the solid-state image pickup unit of the present technology, any configuration other than that illustrated in FIG. 28 is allowed to be adopted.

It is to be noted that the present disclosure is allowed to have following configurations.

(1) A solid-state image pickup unit including:

a substrate;

a photoelectric conversion section formed on a light incident side of the substrate and generating a signal charge according to a light amount;

a first charge accumulation section formed in the substrate on the light incident side and accumulating a signal charge generated by the photoelectric conversion section;

a second charge accumulation section formed in a region other than a light-condensing region where incident light is condensed in the substrate on a side opposite to the light incident side and formed to be laminated together with the first charge accumulation section in a depth direction of the substrate; and a floating diffusion section formed in a region other than the light-condensing region in the substrate on the side opposite to the light incident side and converting the signal charge into a voltage.

(2) The solid-state image pickup unit according to (1), in which the light-condensing region is a region with an optical electric field strength in a range of up to 1/e of a peak optical electric field strength.

(3) The solid-state image pickup unit according to (1) or (2), further including a reset section formed in the light-condensing region in the substrate on the side opposite to the light incident side and for resetting the floating diffusion section.

(4) The solid-state image pickup unit according to any one of (1) to (3), further including a discharge section formed in the light-condensing region in the substrate on the side opposite to the light incident side and discharging a charge from the first charge accumulation section.

(5) The solid-state image pickup unit according to any one of (1) to (4), further including a vertical gate electrode transferring the signal charge from the first charge accumulation section to the second charge accumulation section.

(6) The solid-state image pickup unit according to (4) or (5), further including a vertical gate electrode discharging a charge from the first charge accumulation section to the discharge section.

(7) The solid-state image pickup unit according to any one of (1) to (6), in which the solid-state image pickup unit has a configuration in which the signal charge generated by the photoelectric conversion section is collected into the first charge accumulation section by an internal electric field in the substrate.

(8) The solid-state image pickup unit according to any one of (1) to (7), in which the solid-state image pickup unit has a configuration in which the signal charge generated by the photoelectric conversion section is collected into the first accumulation section by an external electric field by a transparent electrode.

(9) The solid-state image pickup unit according to any one of (1) to (8), in which the photoelectric conversion section doubles as a light-shielding section.

(10) The solid-state image pickup unit according to any one of (1) to (9), in which the photoelectric conversion section includes a photoelectric conversion film formed of a compound semiconductor with a chalcopyrite structure.

(11) The solid-state image pickup unit according to (10), in which the photoelectric conversion film is formed of a compound semiconductor with a chalcopyrite structure made of a copper-aluminum-gallium-indium-sulfur-selenium-based mixed crystal.

(12) The solid-state image pickup unit according to any one of (1) to (9), in which the photoelectric conversion section includes a photoelectric conversion film formed of a silicide-based material.

(13) The solid-state image pickup unit according to (10) or (11), in which the photoelectric conversion film is formed to be lattice-matched to the substrate on the substrate.

(14) The solid-state image pickup unit according to (13), in which the substrate is an off substrate.

(15) The solid-state image pickup unit according to any one of (1) to (14), further including an intermediate layer having larger electron affinity than the substrate, formed between the photoelectric conversion section and the substrate, and formed to have electron affinity between the electron affinity of the substrate and the electron affinity of the photoelectric conversion section.

(16) The solid-state image pickup unit according to any one of (1) to (9), in which the photoelectric conversion section includes a photoelectric conversion film formed of an organic material.

(17) The solid-state image pickup unit according to (10) or (11), in which a pixel isolation section is included, the pixel isolation section formed of a compound semiconductor of which a doping concentration or a composition is controlled to serve as a potential barrier between the photoelectric conversion sections, and the pixel isolation section isolating adjacent pixels from one another.

(18) The solid-state image pickup unit according to any one of (1) to (17), in which a plurality of pixels each including the photoelectric conversion section, the floating diffusion section, the first charge accumulation section, and the second charge accumulation section are included, the plurality of pixels are arranged in a two-dimensional array, signal charges accumulated in the first charge accumulation sections are transferred to the second charge accumulation sections simultaneously in all of the pixels to be held by the second charge accumulation sections, and the signal charges held by the second charge accumulation sections are transferred to the floating diffusion sections from one pixel row to another.

(19) An electronic apparatus including:
an optical lens;
the solid-state image pickup unit according to any one of (1) to (18); and a signal processing circuit processing an output signal from the solid-state image pickup unit.

The present technology is not limited to the above-described embodiments, and may have any other various configurations without departing from the scope of the present technology.

The present disclosure contains subject matter related to that disclosed in Japanese Priority Patent Application No. 2012-210938 filed in the Japan Patent Office on Sep. 25, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A solid-state image pickup unit, comprising:
a substrate;
a photoelectric conversion section on a light incident side of the substrate, wherein the photoelectric conversion section is configured to generate a signal charge based on a light amount;
a first charge accumulation section in the substrate on the light incident side, wherein the first charge accumulation section is configured to accumulate the signal charge generated by the photoelectric conversion section;
a second charge accumulation section in a first region, other than a light-condensing region, on a side opposite to the light incident side, and laminated together with the first charge accumulation section in a depth direction of the substrate, wherein the light-condensing region is a second region where incident light is condensed in the substrate;
a floating diffusion section in a third region, other than the light-condensing region in the substrate, on the side opposite to the light incident side, wherein the floating diffusion section is configured to convert the signal charge into a voltage;
a discharge section in the light-condensing region in the substrate on the side opposite to the light incident side, wherein the discharge section is configured to discharge a charge from the first charge accumulation section; and
a vertical gate electrode configured to discharge the charge from the first charge accumulation section to the discharge section.

2. The solid-state image pickup unit according to claim 1, wherein the light-condensing region comprises an optical electric field strength in a range of up to 1/e of a peak optical electric field strength.

3. The solid-state image pickup unit according to claim 1, further comprising a reset section in the light-condensing region in the substrate on the side opposite to the light incident side, wherein the reset section is configured to reset the floating diffusion section.

4. The solid-state image pickup unit according to claim 1, wherein the vertical gate electrode is configured to transfer the signal charge from the first charge accumulation section to the second charge accumulation section.

5. The solid-state image pickup unit according to claim 1, wherein the solid-state image pickup unit has a configuration in which the signal charge generated by the photoelectric conversion section is collected into the first charge accumulation section by an internal electric field in the substrate.

6. The solid-state image pickup unit according to claim 1, wherein the solid-state image pickup unit has a configuration in which the signal charge generated by the photoelectric conversion section is collected into the first charge accumulation section by an external electric field by a transparent electrode.

7. The solid-state image pickup unit according to claim 1, wherein the photoelectric conversion section is configured to act as a light shielding section.

8. The solid-state image pickup unit according to claim 1, wherein the photoelectric conversion section includes a photoelectric conversion film of a first compound semiconductor with a chalcopyrite structure.

9. The solid-state image pickup unit according to claim 8, wherein the first compound semiconductor with the chalcopyrite structure is made of a copper-aluminum-gallium-indium-sulfur-selenium-based mixed crystal.

10. The solid-state image pickup unit according to claim 1, wherein the photoelectric conversion section includes a photoelectric conversion film of a silicide-based material.

11. The solid-state image pickup unit according to claim 8, wherein the photoelectric conversion film is lattice-matched to the substrate.

12. The solid-state image pickup unit according to claim 11, wherein the substrate is an off substrate.

13. The solid-state image pickup unit according to claim 1, further comprising an intermediate layer, between the substrate and the photoelectric conversion section, with a first electron affinity larger than a second electron affinity of the substrate, wherein the first electron affinity of the intermediate layer is between the second electron affinity of the substrate and a third electron affinity of the photoelectric conversion section.

14. The solid-state image pickup unit according to claim 1, wherein the photoelectric conversion section includes a photoelectric conversion film of an organic material.

15. The solid-state image pickup unit according to claim 8, further comprising a pixel isolation section in the substrate, wherein the pixel isolation section is of a second compound semiconductor of which a doping concentration or a composition is controlled to serve as a potential barrier between each pixel of a plurality of pixels on the substrate, and the pixel isolation section is configured to isolate a pixel of the plurality of pixels from an adjacent pixel of the plurality of pixels.

16. The solid-state image pickup unit according to claim 1, wherein each pixel of a plurality of pixels includes the photoelectric conversion section, the floating diffusion section, the first charge accumulation section, and the second charge accumulation section,
wherein the plurality of pixels are arranged in a two-dimensional array, and the signal charge accumulated in the first charge accumulation section of each pixel of the plurality of pixels is concurrently transferred to the second charge accumulation section of each pixel of the plurality of pixels, and the signal charge held by the second charge accumulation section of each pixel of the plurality of pixels is transferred to the floating diffusion section, of each pixel of the plurality of pixels, from a first pixel row of a plurality of pixel rows to a second pixel row of the plurality of pixel rows.

17. An electronic apparatus, comprising:
an optical lens;
a solid-state image pickup unit including a substrate, a photoelectric conversion section, a first charge accumulation section, a second charge accumulation section, and a floating diffusion section,
wherein the photoelectric conversion section is on a light incident side of the substrate, and is configured to generate a signal charge based on a light amount,
wherein the first charge accumulation section is in the substrate on the light incident side, and is configured to accumulate the signal charge generated by the photoelectric conversion section,
wherein the second charge accumulation section is in a first region, other than a light-condensing region, on a side opposite to the light incident side, and laminated together with the first charge accumulation section in a depth direction of the substrate, wherein the light-condensing region is a second region where incident light is condensed in the substrate, and
wherein the floating diffusion section is formed in a third region, other than the light-condensing region in the substrate, on the side opposite to the light incident side, and is configured to convert the signal charge into a voltage;
a discharge section in the light-condensing region in the substrate on the side opposite to the light incident side, wherein the discharge section is configured to discharge a charge from the first charge accumulation section;
a vertical gate electrode configured to discharge the charge from the first charge accumulation section to the discharge section; and
a signal processing circuit configured to process an output signal from the solid-state image pickup unit.

* * * * *